(12) United States Patent
Narita

(10) Patent No.: US 11,114,849 B2
(45) Date of Patent: Sep. 7, 2021

(54) SEMICONDUCTOR DEVICE AND SEMICONDUCTOR DEVICE SYSTEM

(71) Applicant: RENESAS ELECTRONICS CORPORATION, Tokyo (JP)

(72) Inventor: Koki Narita, Tokyo (JP)

(73) Assignee: RENESA.S ELECTRONICS CORPORATION, Tokyo (JP)

( * ) Notice: Subject to any disclaimer, the term of this patent is extended or adjusted under 35 U.S.C. 154(b) by 47 days.

(21) Appl. No.: 16/654,901

(22) Filed: Oct. 16, 2019

(65) Prior Publication Data

US 2020/0185913 A1  Jun. 11, 2020

(30) Foreign Application Priority Data

Dec. 11, 2018 (JP) .............................. JP2018-231270

(51) Int. Cl.
*H02H 9/04* (2006.01)
*H02H 1/00* (2006.01)

(52) U.S. Cl.
CPC .......... *H02H 9/046* (2013.01); *H02H 1/0007* (2013.01)

(58) Field of Classification Search
CPC .................. H02H 9/046; H02H 1/0007; H01L 27/0248–0296
See application file for complete search history.

(56) References Cited

U.S. PATENT DOCUMENTS

| | | | |
|---|---|---|---|
| 6,507,469 B2 | 1/2003 | Andoh | |
| 6,522,511 B1* | 2/2003 | John | H02H 9/046 361/111 |
| 2011/0304940 A1 | 12/2011 | Cao et al. | |
| 2011/0317316 A1 | 12/2011 | Mozak et al. | |
| 2015/0162746 A1 | 6/2015 | Ikeda | |
| 2016/0126942 A1 | 5/2016 | Narita | |
| 2016/0241021 A1 | 8/2016 | Wang et al. | |
| 2016/0322806 A1* | 11/2016 | Bakhali | H02H 9/041 |
| 2017/0373490 A1* | 12/2017 | Zhu | H02H 9/046 |
| 2018/0301898 A1* | 10/2018 | Hsu | H01L 27/0285 |
| 2019/0128939 A1* | 5/2019 | O'Donnell | G01R 31/002 |
| 2019/0341772 A1* | 11/2019 | Hsu | H02H 1/0007 |
| 2020/0035668 A1* | 1/2020 | Savanth | H02H 1/0007 |
| 2020/0083704 A1* | 3/2020 | Huang | H01L 27/0285 |

FOREIGN PATENT DOCUMENTS

JP  2001-358297 A  12/2001

OTHER PUBLICATIONS

Extended European Search Report issued in corresponding European Patent Application No. 19209311.0-1230, dated Apr. 14, 2020.

* cited by examiner

*Primary Examiner* — Fred E Finch, III
(74) *Attorney, Agent, or Firm* — McDermott Will & Emery LLP

(57) ABSTRACT

The present invention provides both a margin of a discharge start voltage with respect to a power supply voltage and a margin of a clamp voltage with respect to a breakdown withstand voltage of an internal circuit. The semiconductor device according to the embodiment includes a first amplifier circuit for amplifying a detection signal and outputting a drive signa, a second amplifier circuit for feedback-amplifying the detection signal to be input to the first amplifier circuit, and a discharge element whose discharge capability changed according to the magnitude of the drive signal.

14 Claims, 22 Drawing Sheets

SEMICONDUCTOR DEVICE AND SEMICONDUCTOR DEVICE SYSTEM

CROSS-REFERENCE TO RELATED APPLICATIONS

The disclosure of Japanese Patent Application No. 2018-231270 filed on Dec. 11, 2018 including the specification, drawings and abstract is incorporated herein by reference in its entirety.

BACKGROUND

The present invention relates to semiconductor device and semiconductor device systems, for example semiconductor device and semiconductor device systems with discharge elements.

THE BACKGROUND OF THE INVENTION

For example, a semiconductor integrated circuit is provided with an electrostatic protection circuit for protecting an internal circuit from noise (ESD noise) caused by ESD (Electro-Static Discharge). As an electrostatic protection circuit, an RC-triggered electrostatic protection circuit for driving a discharge element using a transient detection circuit composed of an RC circuit is known.

In recent years, there has been a demand for an electrostatic protection circuit capable of protecting an internal circuit from not only ESD noise having a sharp rise and a narrow pulse width but also EMS (Electro-Magnetic Susceptibility) noise having a slow rise and a wide pulse width. In the above-mentioned RC-triggered electrostatic protection circuit, the transient detection circuit does not operate, and the discharge element cannot be driven when EMS noise occurs, so that the internal circuit cannot be properly protected.

On the other hand, Japanese unexamined Patent Application publication No. 2001-358297 and US Patent Application Publication No, 2011/304940 disclose a voltage-triggered electrostatic protection circuit that drives a discharge element based on a voltage detected by a voltage detection circuit including a diode string. In such a voltage-triggered electrostatic protection circuit, the discharge element is driven when a predetermined voltage is reached regardless of whether ESD noise or EMS noise is generated.

SUMMARY

The present inventor has found the following problems with a voltage-triggered electrostatic protection circuit or semiconductor device that drives the discharging elements based on the voltage detected by the voltage detecting circuit. System level ESD noise and EMS noise may occur during operation of the internal circuit. Therefore, if the voltage at which the discharge element starts discharging (hereinafter referred to as "discharge start voltage") is lower than the operating voltage of the internal circuit, that is, the power supply voltage, there is a possibility that the operation of the internal circuit is hindered at the time of discharging. Therefore, it is preferable that the discharge start voltage is high within a range not exceeding the breakdown withstand voltage of the internal circuit. On the other hand, if the discharge start voltage is too close to the breakdown withstand voltage of the internal circuit, the voltage during discharge, i.e., the so-called clamp voltage, exceeds the breakdown withstand voltage of the internal circuit.

That is, in the voltage-triggered electrostatic protection circuit, it is difficult to achieve both the margin of the discharge start voltage with respect to the power supply voltage and the margin of the clamp voltage with respect to the breakdown withstand voltage of the internal circuit.

Other objects and novel features will become apparent from the description of this specification and the accompanying drawings.

The semiconductor device according to one embodiment includes a first amplifier circuit for amplifying an input detection signal and outputting a drive signal, a second amplifier circuit for feedback-amplifying a detection signal input to the first amplifier circuit, and a discharge device whose discharge capability changes according to the magnitude of the drive signal.

According to the present invention, the margin of the discharge start voltage with respect to the power supply voltage and the margin of the clamp voltage with respect to the breakdown withstand voltage of the internal circuit can be made compatible with each other.

DETAILED DESCRIPTION

Hereinafter, specific embodiments will be described in detail with reference to the drawings. However, the present invention is not limited to the following embodiments. In order to clarify the description, the following description and the drawings are appropriately simplified.

Comparative Example

Figure 1:
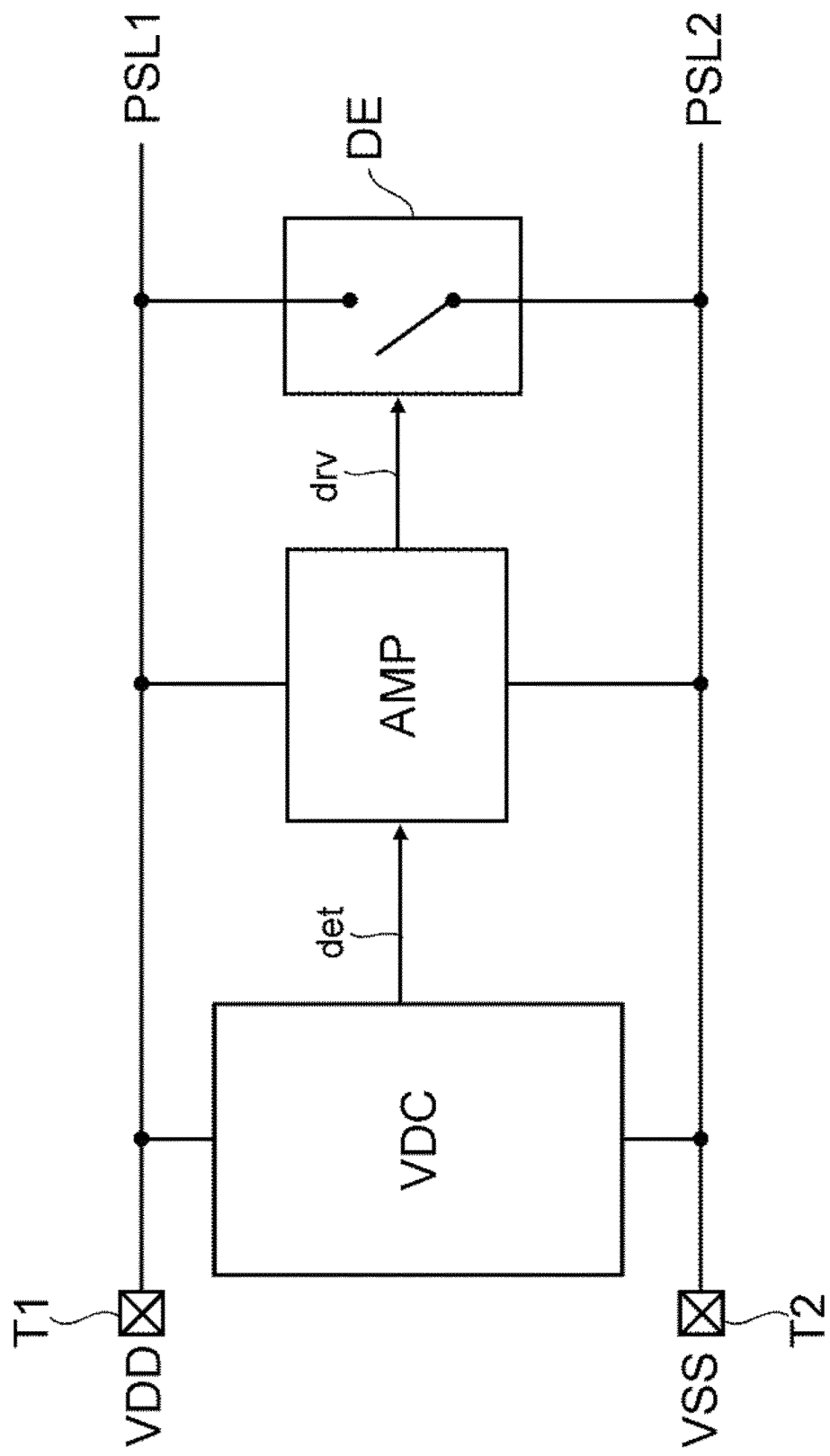
FIG. 1 is a block diagram showing a configuration of a semiconductor device according to a comparative example.

First, a semiconductor device according to a comparative example which the inventor has studied in advance will be described. FIG. 1 is a block diagram showing a configuration of a semiconductor device according to a comparative example. As shown in FIG. 1, the semiconductor device according to the comparative embodiment is a voltage-triggered electrostatic protection circuit including a discharge element DE, a voltage detection circuit VDC, and an amplifier circuit AMP.

The discharge element DE is a switching element for causing a discharge current IESD to flow when noises occur between the first terminal T1 and the second terminal T2. That is, the discharge element DE is provided between the first power supply line PSL1 connected to the first terminal T1 and the second power supply line PSL2 connected to the second terminal T2. Here, as shown in FIG. 1, for example, the power supply voltage VDD on the high potential side is applied to the first terminal T1, and the power supply voltage VSS on the low potential side is applied to the second terminal T2.

The voltage detection circuit VDC is provided between the first terminal T1 and the second terminal T2. When noise is generated between the first terminal T1 and the second terminal T2, the voltage between the first terminal T1 and the second terminal T2 (hereinafter referred to as "inter-terminal voltage") reaches the operating voltage of the voltage detection circuit VDC, the voltage detection circuit VDC outputs the detection signal det. The operating voltage of the voltage detection circuit VDC is a predetermined threshold value exceeding the power supply voltage VDD.

The amplifier circuit AMP amplifies the input detection signal det and outputs a drive signal dry for driving the discharge element DE. The discharge element DE is driven based on the drive signal dry, the state of the discharge element DE changes from the OFF state to the ON state, and the discharge current IESD flows between the first terminal T1 and the second terminal T2.

As described above, when noise is generated between the first terminal T1 and the second terminal T2 and the voltage between the terminals reaches the operating voltage of the voltage detection circuit VDC, the voltage detection circuit VDC starts operating and outputs the detection signal det. Accordingly, the amplifier circuit AMP also starts to operate, and outputs the drive signal dry to drive the discharge element DE. That is, the discharge start voltage at which the discharge element DE starts discharging is the operating voltage of the voltage detection circuit VDC.

Figure 2:
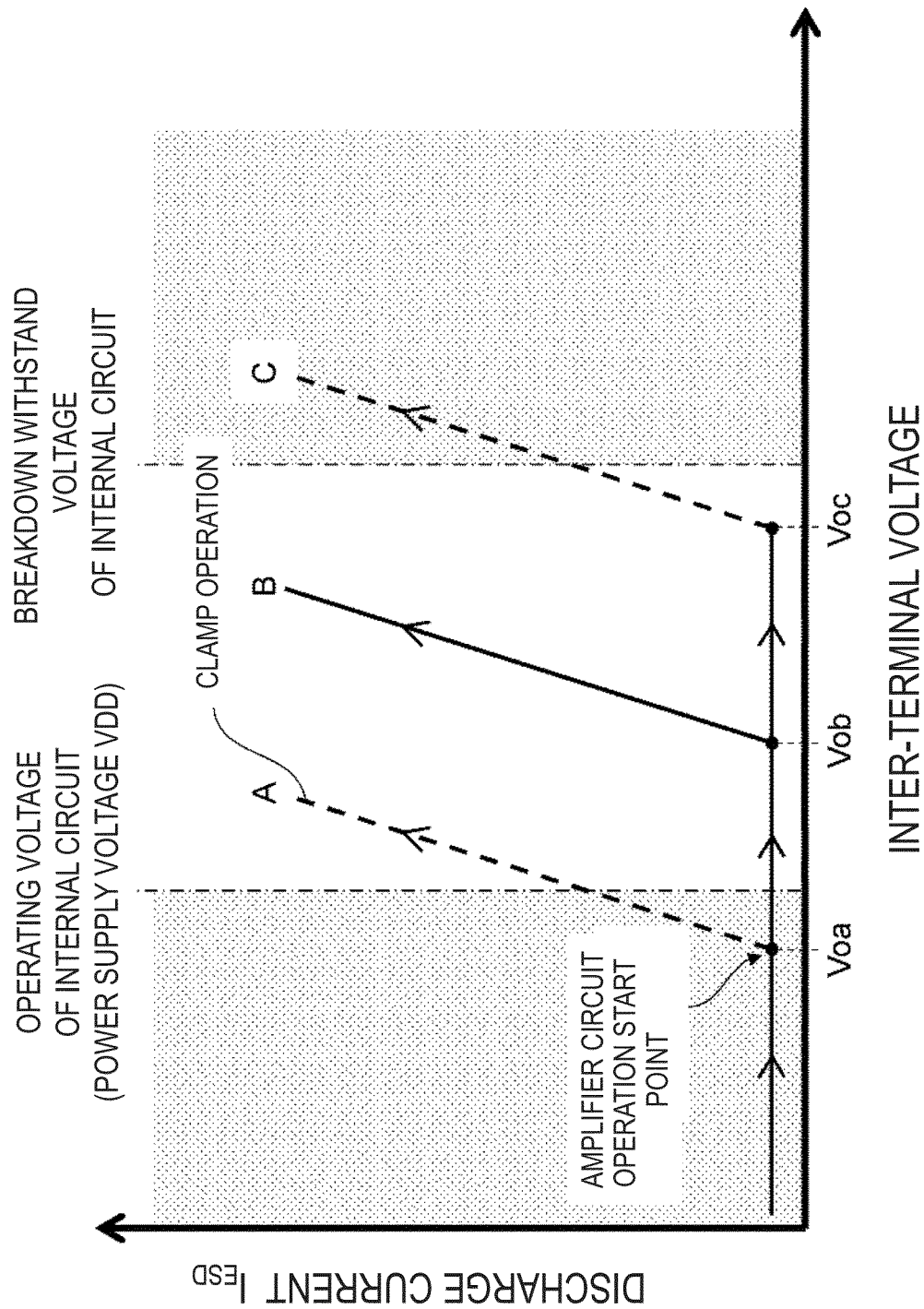
FIG. 2 is a graph showing the discharging characteristics of the semiconductor device according to the comparative example.

FIG. 2 is a graph showing the discharging characteristics of the semiconductor device according to the comparative example. In FIG. 2, the horizontal axis represents the voltage between the first terminal T1 and the second terminal T2, and the vertical axis represents the discharge current IESD. FIG. 2 shows three patterns of discharge patterns A, B, and C. In FIG. 2, the operating voltage of the internal circuit, i.e., the power supply voltage VDD, and the breakdown withstand voltage of the internal circuit are indicated by a dashed-dotted line.

As noted above, system level ESD noise and EMS noise may occur during operation of the internal circuit. Here, in the discharge pattern A shown by the broken line in FIG. 2, the operating voltage Voa of the voltage detection circuit VDC is lower than the operating voltage of the internal circuit, i.e., the power supply voltage VDD. Therefore, when the discharge element DE is driven, the power supply voltage VDD may be lowered, which may hinder the operation of the internal circuit. Therefore, it is preferable that the operating voltage of the voltage detection circuit VDC is high within a range not exceeding the breakdown withstand voltage of the internal circuit.

On the other hand, in the discharge pattern C shown by the broken line in FIG. 2, the operating voltage Voc of the voltage detection circuit VDC is too close to the breakdown withstand voltage of the internal circuit. Therefore, the voltage between the terminals (clamp voltage) during discharge, that is, during the clamp operation exceeds the breakdown withstand voltage of the internal circuit, and there is a fear that the internal circuit is broken down.

Therefore, as in the discharge pattern B shown by the solid line in FIG. 2, it is necessary to make the operating voltage Vo of the voltage detection circuit VDC higher than the power supply voltage VDD and to prevent the clamp voltage from exceeding the breakdown withstand voltage of the internal circuit. As described above, in the semiconductor device according to the comparative example shown in FIG. 1, it is difficult to achieve both the margin of the operating voltage of the voltage detection circuit VDC with respect to the power supply voltage VDD and the margin of the clamp voltage with respect to the breakdown withstand voltage of the internal circuit.

First Embodiment

Figure 3:
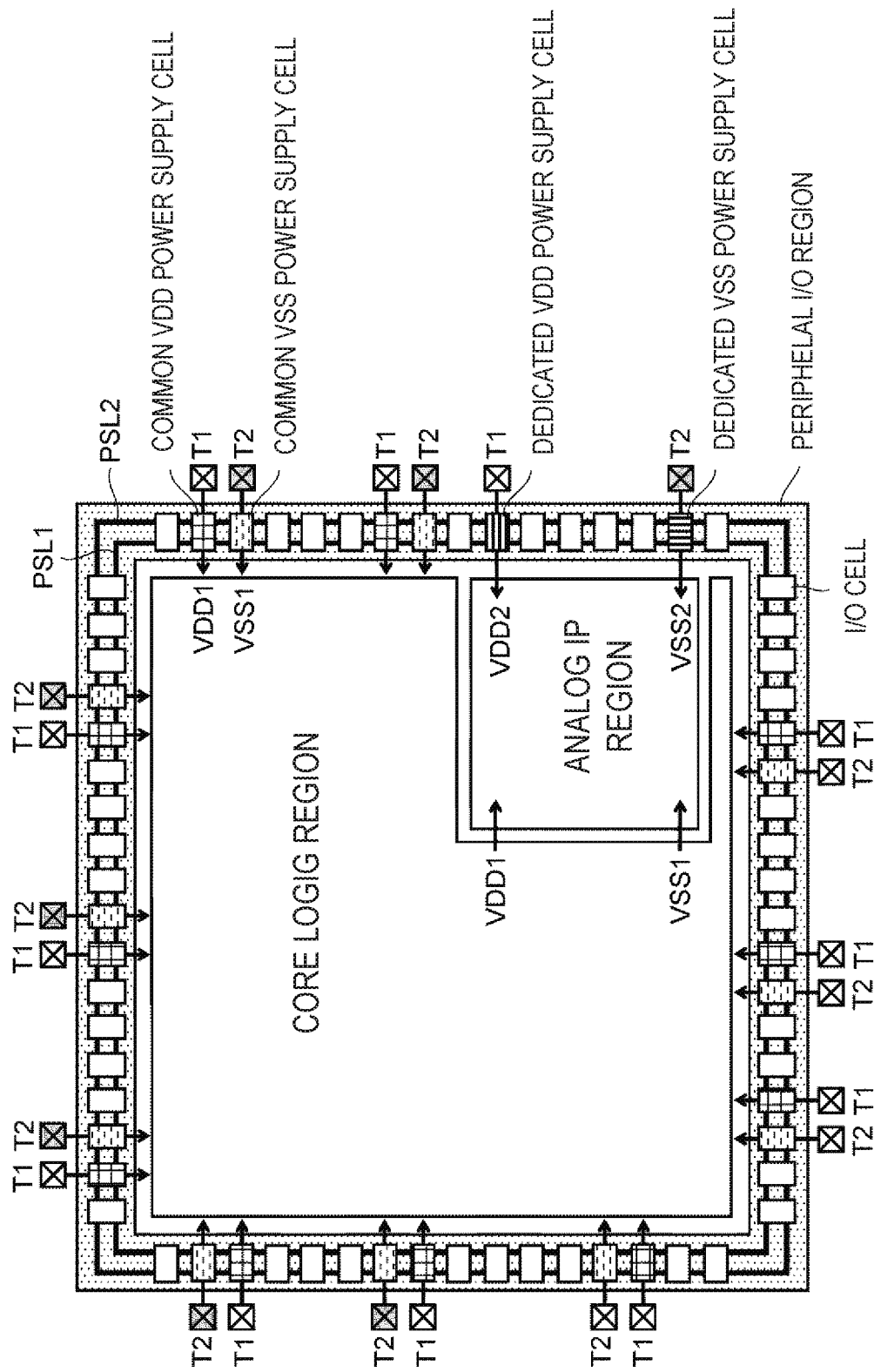
FIG. 3 is a schematic diagram showing a layout of a semiconductor system with a semiconductor device according to a first embodiment.

Hereinafter, a semiconductor device according to a first embodiment will be described. First, referring to FIG. 3, a semiconductor device system on which the semiconductor device according to the first embodiment is mounted will be described. FIG. 3 is a schematic diagram showing layouts of semiconductor device systems on which the semiconductor device according to the first embodiment is mounted.

As shown in FIG. 3, the semiconductor device system is an analog-digital embedded semiconductor integrated circuit including a core logic region and an analog IP (Intellectual Property) region on one semiconductor chip, i.e., SoC (System On a Chip). A peripheral I/O region is formed around a rectangular internal circuit region including the core logic region, which is a large-scale circuit region in which a plurality of logic circuits are formed, and the analog IP region, which is a small-scale circuit region in which a plurality of analog circuits are formed.

As shown in FIG. 3, in the peripheral I/O region, a square-ring-shaped first power supply line PSL1 and a second power supply line PSL2 are provided in parallel with each other along the circumferential direction of the peripheral I/O region. A plurality of I/O cells, a common VDD power supply cell (e.g., a first power supply cell), and a common VSS power supply cell (e.g., a second power supply cell) are arranged between the first power supply line PSL1 and the second power supply line PSL2, respectively, along the circumferential directions of the peripheral I/O regions. A pair of dedicated VDD power supply cells and a dedicated VSS power supply cell are provided in the peripheral I/O region adjacent to the analog IP region.

The I/O cells are used to input/output a signal to/from a peripheral device. The common VDD power supply cell is a cell for supplying the high-potential power supply voltage VDD1 to the core logic region and the analog IP region from the outside. The common VSS power supply cell is a cell for supplying the low-potential power supply voltage VSS1 to the core logic region and the analog-IP region from the outside. The dedicated VDD power supply cell is a cell for supplying the power supply voltage VDD2 to the analog IP region exclusively. The dedicated VSS power supply cell is a cell for supplying the power supply voltage VSS2 to the analog-IP region exclusively.

The first power supply line PSL1 is connected to the first terminal T1 to which the power supply voltage VDD1 is applied via the common VDD power supply cell. The second power supply line PSL2 is connected to the second terminal T2 to which the power supply voltage VSS1 is applied via the common-VSS power supply cell. The analog IP region shown in FIG. 3 is divided into a dedicated power supply region and a common power supply region. Power supply voltages VDD2 and VSS2 are supplied to the dedicated power supply region via the dedicated VDD power supply cell and the dedicated VSS power supply cell from the outside. On the other hand, the power supply voltages VDD1 and VSS1 are supplied to the common power supply region via the core logic region.

The electrostatic protection circuit in the semiconductor device according to the first embodiment, is provided in each of the common VDD power supply cell, the common VSS power supply cell, the dedicated VDD power supply cell, and the dedicated VSS power supply cell. The electrostatic protection circuit of the semiconductor device according to the first embodiment may be provided in an I/O cell.

Configuration of Semiconductor Device

Figure 4:
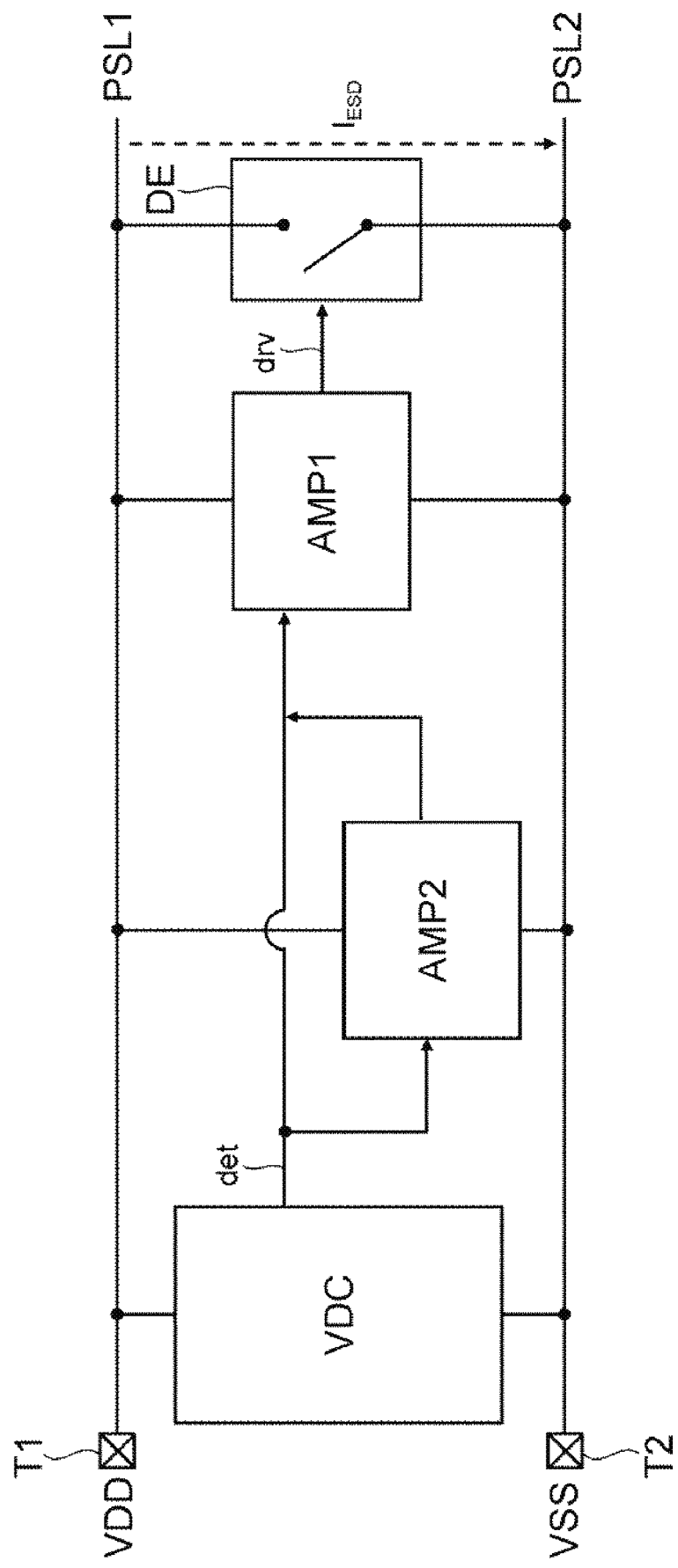
FIG. 4 is a block diagram showing the configuration of the semiconductor device according to the first embodiment.

Next, referring to FIG. 4, a semiconductor device according to the first embodiment will be described. FIG. 4 is a diagram showing a configuration of a semiconductor device according to the first embodiment. As shown in FIG. 4, the semiconductor device according to the first embodiment is a voltage-triggered electrostatic protection circuit including a discharge element DE, a voltage detection circuit VDC, a first amplifier circuit AMP1, and a second amplifier circuit AMP2. That is, the semiconductor device according to the first embodiment has a configuration in which the second amplifier circuits AMP2 are added to the configuration of the semiconductor device according to the comparative examples shown in FIG. 1.

The discharge element DE is a switching element for causing a discharge current IESD to flow when noises occur between the first terminal T1 and the second terminal T2. The discharge element DE is provided between the first power supply line PSL1 connected to the first terminal T1 and the second power supply line PSL2 connected to the second terminal T2. As shown in FIG. 4, for example, the power supply voltage VDD on the high potential side is applied to the first terminal T1, and the power supply voltage VSS on the low potential side is applied to the second terminal T2. The discharge element DE is driven based on the drive signal dry outputted from the first amplifier AMP1, and the discharge capability of the discharge element DE changes in accordance with the magnitude of the drive signal dry. The first terminal T1 may be a signal terminal.

The voltage detection circuit VDC is provided between the first terminal T1 and the second terminal T2. When noise is generated between the first terminal T1 and the second terminal T2 and the voltage between the terminals reaches the operating voltage of the voltage detection circuit VDC, the voltage detection circuit VDC outputs the detection signal det. The operating voltage of the voltage detection circuit VDC is a predetermined threshold value higher than the power supply voltage VDD and lower than the breakdown withstand voltage of the internal circuit.

The first amplifier AMP1 amplifies the detected signal det input to the first input node, and outputs a drive signal dry for driving the discharge element DE from the first output node. The discharge element DE is driven based on the drive signal dry, the state of the discharge element DE changes from the OFF state to the ON state, and the discharge current IESD flows between the first terminal T1 and the second terminal T2. As a result, the voltage between the terminals is clamped.

The second amplifier circuit AMP2 feedback-amplifies the inputted detected signals det. That is, an amplified signal obtained by amplifying the detected signal det is outputted to the first input node of the first amplifier circuit AMP1. Here, when noises occur between the first terminal T1 and the second terminal T2, the second amplifier circuit AMP2 starts to operate separately from the first amplifier circuit AMP1. When the second amplifier circuit AMP2 operates, the detected signal det amplified by the second amplifier circuit AMP2 is inputted to the first amplifier circuit AMP1, and the drive signal dry outputted from the first amplifier circuit AMP1 also increases. As a result, the discharge element DE is turned on more strongly, and the clamp voltage can be lowered.

Operation of Semiconductor Device

Figure 5:
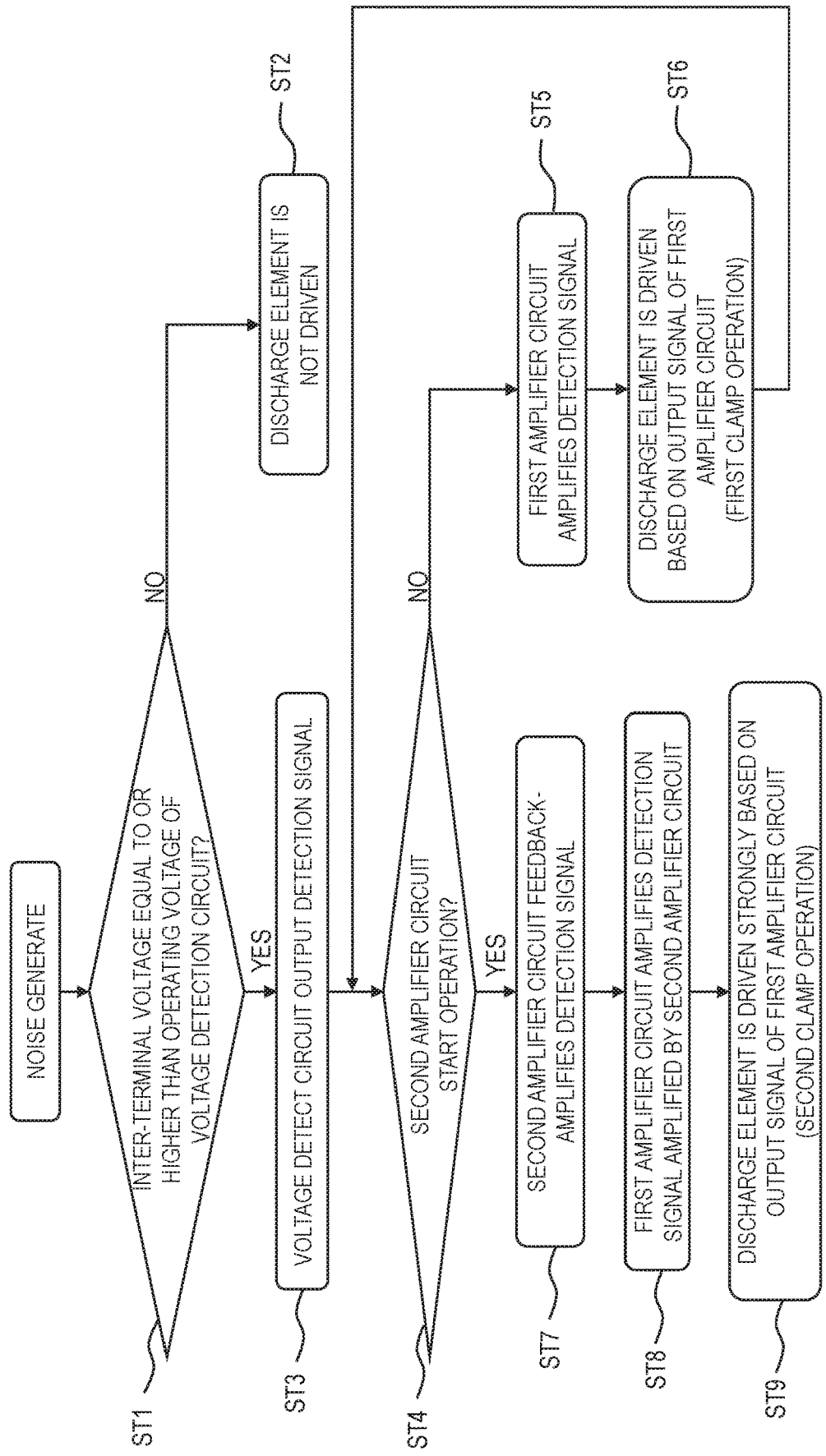
FIG. 5 is a flow chart showing the operation of the semiconductor device when noise is generated according to the first embodiment.

Next, referring to FIG. 5, the operation of the semiconductor device according to the first embodiment at the time of generation of noises will be described. FIG. 5 is a flow chart showing the operation of the semiconductor device according to the first embodiment when noises are generated. As shown in FIG. 5, when noises occur between the first terminal T1 and the second terminal T2, if the inter-terminal voltage is less than the operating voltage of the voltage detection circuit VDC (step ST1NO), the voltage detection circuit VDC and the first amplifier circuit AMP1 do not operate, and the discharge element DE is not driven (step ST2).

On the other hand, if the inter-terminal voltage is equal to or higher than the operating voltage of the voltage detection circuit VDC (step ST1YES), the voltage detection circuit VDC outputs the detection signal det (step ST3). If the second amplifier circuit AMP2 has not started its operation (step ST4NO), the first amplifier circuit AMP1 amplifies the detected signal det (step ST5).

Then, the discharge element DE is driven on the basis of the driving signal (first driving signal) dry outputted from the first amplifier circuit AMP1 (step ST6). That is, the discharge element DE changes from the OFF state to the ON state, the discharge current IESD flows between the first terminal T1 and the second terminal T2, and the voltage between the terminals is clamped. This is referred to as a first clamp operation. As shown in FIG. 5, the first clamp operation is continued until the second amplifier AMP2 starts operating.

When the second amplifier circuit AMP2 starts to operate (step ST4YES), the second amplifier circuit AMP2 feedback-amplifies the detection signal det (step ST7). In step ST8, the first amplifier circuit AMP1 amplifies the detection signal det amplified by the second amplifier circuit AMP2. Then, the discharge element DE is driven more strongly on the basis of the driving signal (second driving signal) dry outputted from the first amplifier circuit AMP1 (step ST9).

As described above, when the second amplifier circuit AMP2 starts operating, the detection signal det amplified by the second amplifier circuit AMP2 is inputted to the first amplifier circuit AMP1, and the drive signal dry outputted from the first amplifier circuit AMP1 also increases. As a result, the discharge element DE is turned on more strongly, the discharge current IESD increases, and the voltage between the terminals of the discharge element DE is clamped to a voltage lower than that of the first clamp operation. This is referred to as a second clamp operation.

Figure 6:
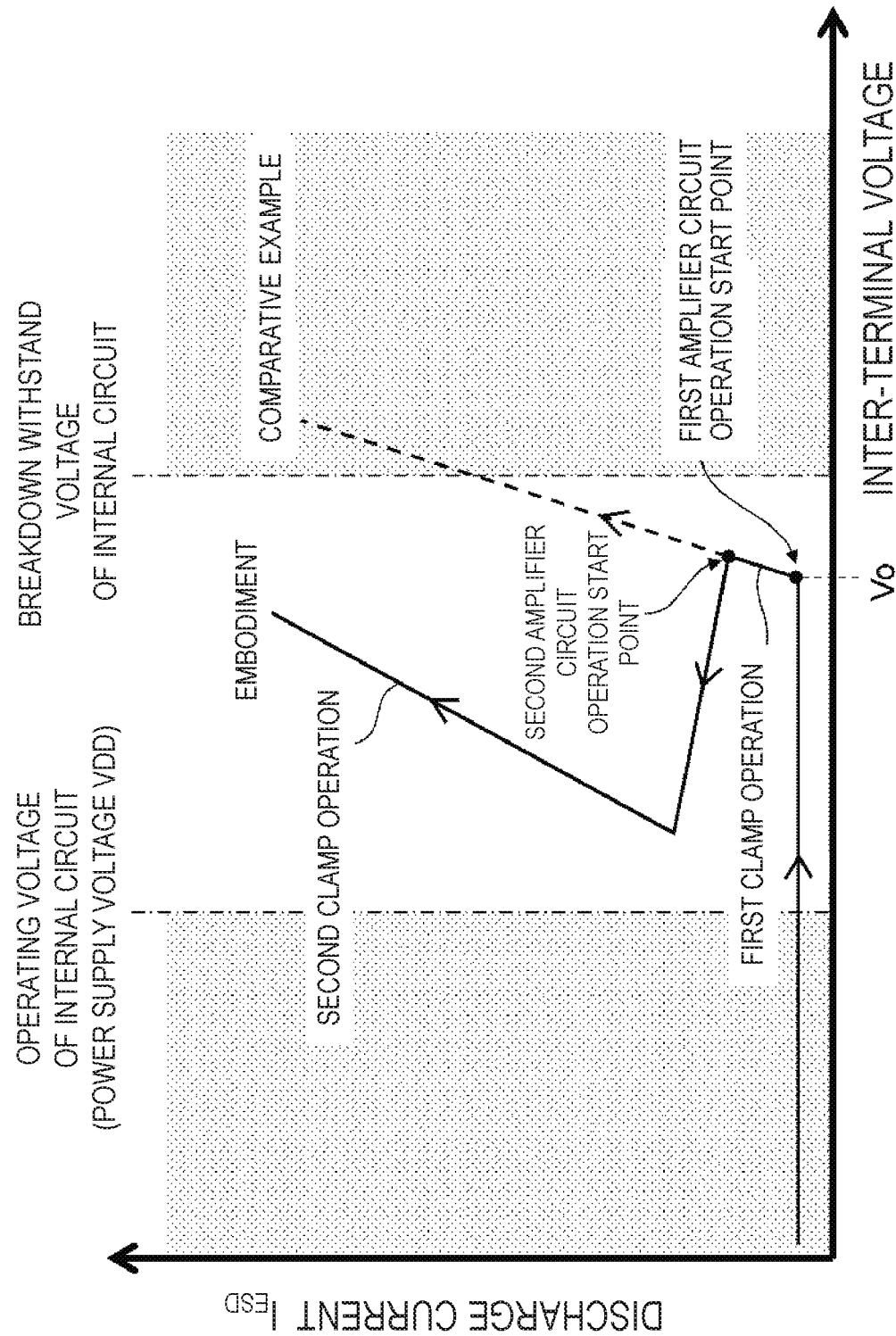
FIG. 6 is a graph showing the discharge characteristics of the semiconductor device according to the first embodiment.

Here, FIG. 6 is a graph showing the discharging characteristics of the semiconductor device according to the first embodiment. In FIG. 6, the horizontal axis represents the voltage between the first terminal T1 and the second terminal T2, and the vertical axis represents the discharge current IESD. In FIG. 6, the operating voltage of the internal circuit, i.e., the power supply voltage VDD, and the breakdown withstand voltage of the internal circuit are indicated by a dashed-dotted line.

As described above, the semiconductor device according to the first embodiment has a configuration in which the second amplifier circuits AMP2 are added to the configuration of the semiconductor device according to the comparative examples. Therefore, as shown in FIG. 6, the same discharging characteristics as those of the comparative examples are exhibited while the second amplifier circuits AMP2 are not operating. Specifically, when the voltage between the terminals reaches the operation voltage Vo of the voltage detection circuit VDC due to generation of noises, the voltage detection circuit VDC and the first amplifier circuit AMP1 start to operate, and the discharge element DE is driven. That is, the discharge element DE changes from the OFF state to the ON state, the discharge current IESD starts to flow between the first terminal T1 and the second terminal T2, and the voltage between the terminals is clamped (first clamp operation).

When the second amplifier AMP2 starts to operate, as described above, the discharge element DE is turned on more strongly, and the discharge current IESD of the discharge element DE increases. Therefore, as shown in FIG. 6, the voltage between the terminals shifts to a voltage lower than that of the first clamp operation and is clamped (second clamp operation).

Therefore, as shown in FIG. 6, it is possible to sufficiently increase the margin of the clamp voltage to the breakdown withstand voltage of the internal circuit, while sufficiently increasing the margin of the operating voltage Vo of the voltage detection circuit VDC to the power supply voltage VDD. That is, in the semiconductor device according to the first embodiment, the margin of the operating voltage Vo of the voltage detecting circuit VDC with respect to the power supply voltage VDD and the margin of the clamping voltage with respect to the breakdown withstand voltage of the internal circuit VDC can be made compatible with each other. In the comparative example shown in FIG. 6, although the margin of the operating voltage Vo of the voltage detection circuit VDC with respect to the power supply voltage VDD is sufficiently large, the clamp voltage exceeds the breakdown withstand voltage of the internal circuit.

Figure 7:
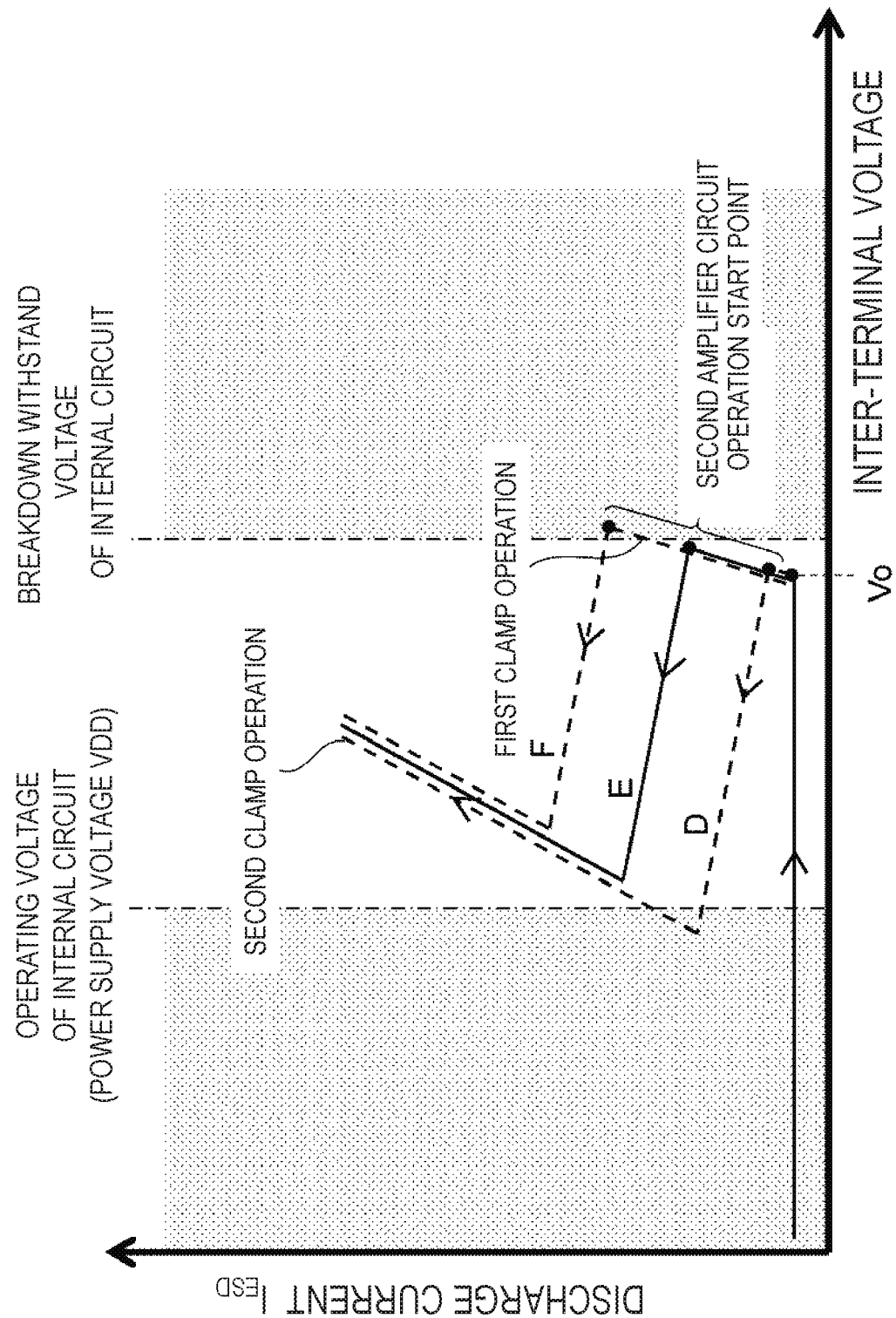
FIG. 7 is a graph showing changes in discharge characteristics when the voltage or current required for starting operation of the second amplifier circuit AMP2 is different.

Next, FIG. 7 is a diagram showing changes in discharging characteristics when voltages or currents required for starting the operation of the second amplifier circuits AMP2 are changed. FIG. 7 shows three patterns of discharging patterns D, E, and F in which voltages or currents required for starting the operation of the second amplifier circuits AMP2 differ.

In the discharge patterns D shown by the broken lines in FIG. 7, the transition to the second clamp operation occurs while the inter-terminal voltages and the discharge currents IESD required for starting the operation of the second amplifier circuits AMP2 are relatively small. As a result, the clamp voltage during the second clamp operation is lower than the power supply voltage VDD. Therefore, when the discharge element DE is driven, the power supply voltage VDD may be lowered, which may hinder the operation of the internal circuit.

On the other hand, in the discharge pattern F shown by the broken line in FIG. 7, the voltage required for starting the operation of the second amplifier circuit AMP2 is large. Therefore, the clamp voltage at the time of the first clamp operation exceeds the breakdown withstand voltage of the internal circuit, and there is a fear that the internal circuit is broken before the second clamp operation occurs.

Therefore, it is necessary to prevent the clamp voltage at the time of the first clamp operation from exceeding the breakdown withstand voltage of the internal circuit and to prevent the clamp voltage at the time of the second clamp operation from falling below the power supply voltage VDD, as in the discharge pattern E shown by the solid line in FIG. 7.

In the semiconductor device according to the first embodiment, the operation of the second amplifier circuit AMP2 and the operation of the first amplifier circuit AMP1 are started separately. Therefore, by adjusting the voltage or current required for starting the operation of the second amplifier circuit AMP2, the clamp voltage at the time of the first clamp operation and the clamp voltage at the time of the second clamp operation can be easily adjusted to appropriate ranges.

Although FIGS. 6 and 7 show the case where the second amplifier circuit AMP2 starts to operate later than the first amplifier circuit AMP1, the voltage or current required to start the operation of the second amplifier circuit AMP2 may be the same as the voltage or current required to start the operation of the first amplifier circuit AMP1 if the clamp voltage at the time of the second clamp operation is not lower than the power supply voltage VDD. That is, if the clamp voltage during the second clamp operation is equal to or higher than the power supply voltage VDD, the first amplifier circuit AMP1 and the second amplifier circuit AMP2 may start to operate when the voltage between the terminals reaches the operation voltage Vo of the voltage detecting circuit VDC.

Detailed Configuration of Semiconductor Device

Figure 8:
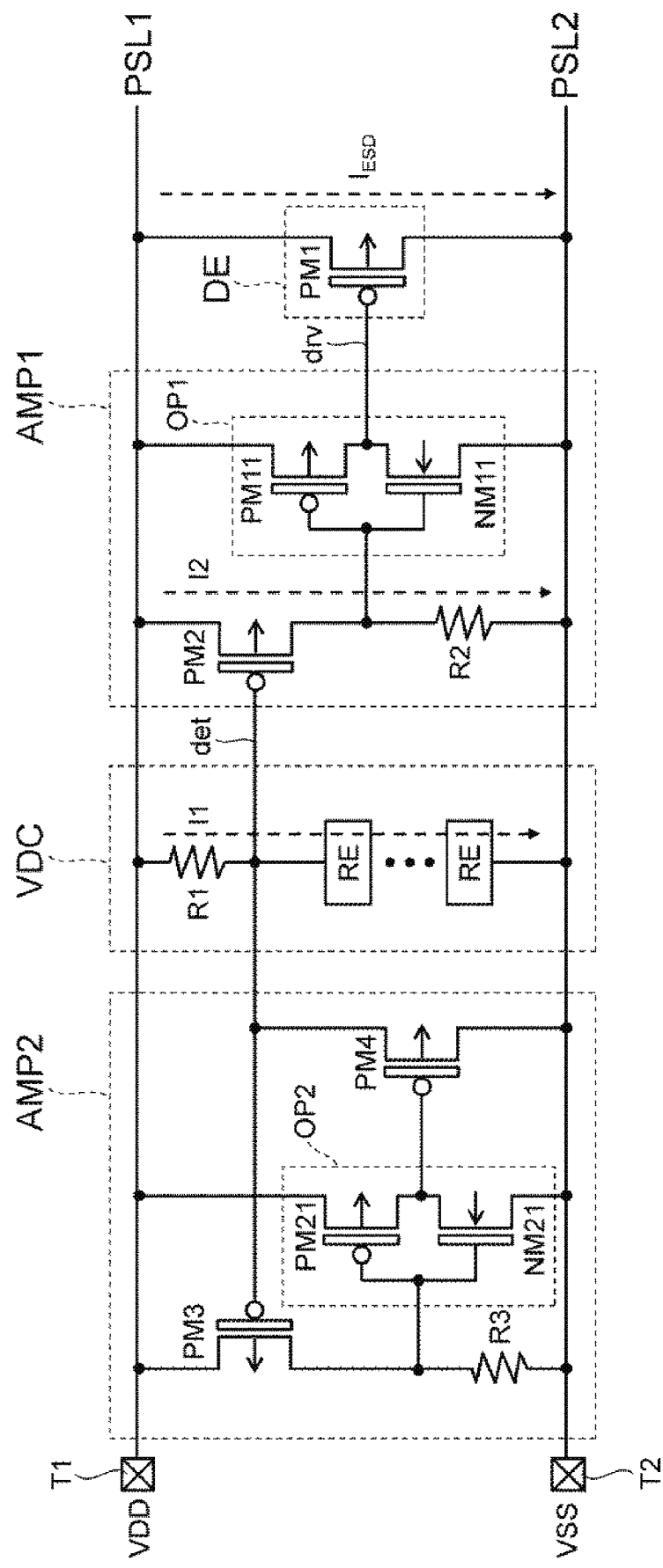
FIG. 8 is a circuit diagram showing the configuration of the semiconductor device according to the first embodiment.

Next, referring to FIG. 8, the semiconductor device according to the first embodiment will be described in more detail. FIG. 8 is a circuit diagram showing a detailed configuration of the semiconductor device according to the first embodiment. That is, FIG. 8 shows a specific circuit configuration of the semiconductor device shown in FIG. 4.

As shown in FIGS. 4 and 8, the semiconductor device according to the first embodiment includes a discharge element DE, a voltage detection circuit VDC, a first amplifier circuit AMP1, and a second amplifier circuit AMP2.

The discharge element DE is a switch element and is composed of, for example, a transistor. In FIG. 8, the discharge element DE includes a PMOS transistor PM1. The PMOS transistor (first PMOS transistor) PM1 is, for example, a large-sized transistor having a total gate width W of several hundred to several thousand gate widths. The source of the PMOS transistor PM1 is connected to the first power supply line PSL1, and the drain of the PMOS transistor PM1 is connected to the second power supply line PSL2. The drive signal drv outputted from the first amplifier circuit AMP1 is inputted to the gate of the PMOS transistor PM1. Based on the drive signal drv, the PMOS transistor PM1 changes from the OFF state to the ON state, and a discharge current IESD flows between the first terminal T1 and the second terminal T2.

As shown in FIG. 8, the voltage detection circuit VDC includes a resistor R1 and a plurality of rectifying elements RE. The plurality of rectifying elements RE are connected in series to form a rectifying element string. One end of the resistor R1 is connected to the first power supply line PSL1, and one end of the rectifying element string is connected to the second power supply line PSL2. The other end of the resistor R1 and the other end of the rectifying element string are connected to each other. That is, the resistor R1 and the rectifying element string are connected in series between the first terminal T1 and the second terminal T2. The operation voltage of the voltage detection circuit VDC can be determined by a product of the operating voltage of one rectifying element RE and the number of connected rectifying elements RE.

A detection signal det is output from a connection node between the resistor R1 and the rectifying element string. When the voltage between the first terminal T1 and the second terminal T2 reaches a predetermined threshold value exceeding the power supply voltage VDD, i.e., the operating voltage of the voltage detection circuit VDC, a current flow through the rectifying element RE, and a detection signal det is output. The magnitude of the detection signal det is the magnitude of the voltage across the resistor R1.

Figure 9:
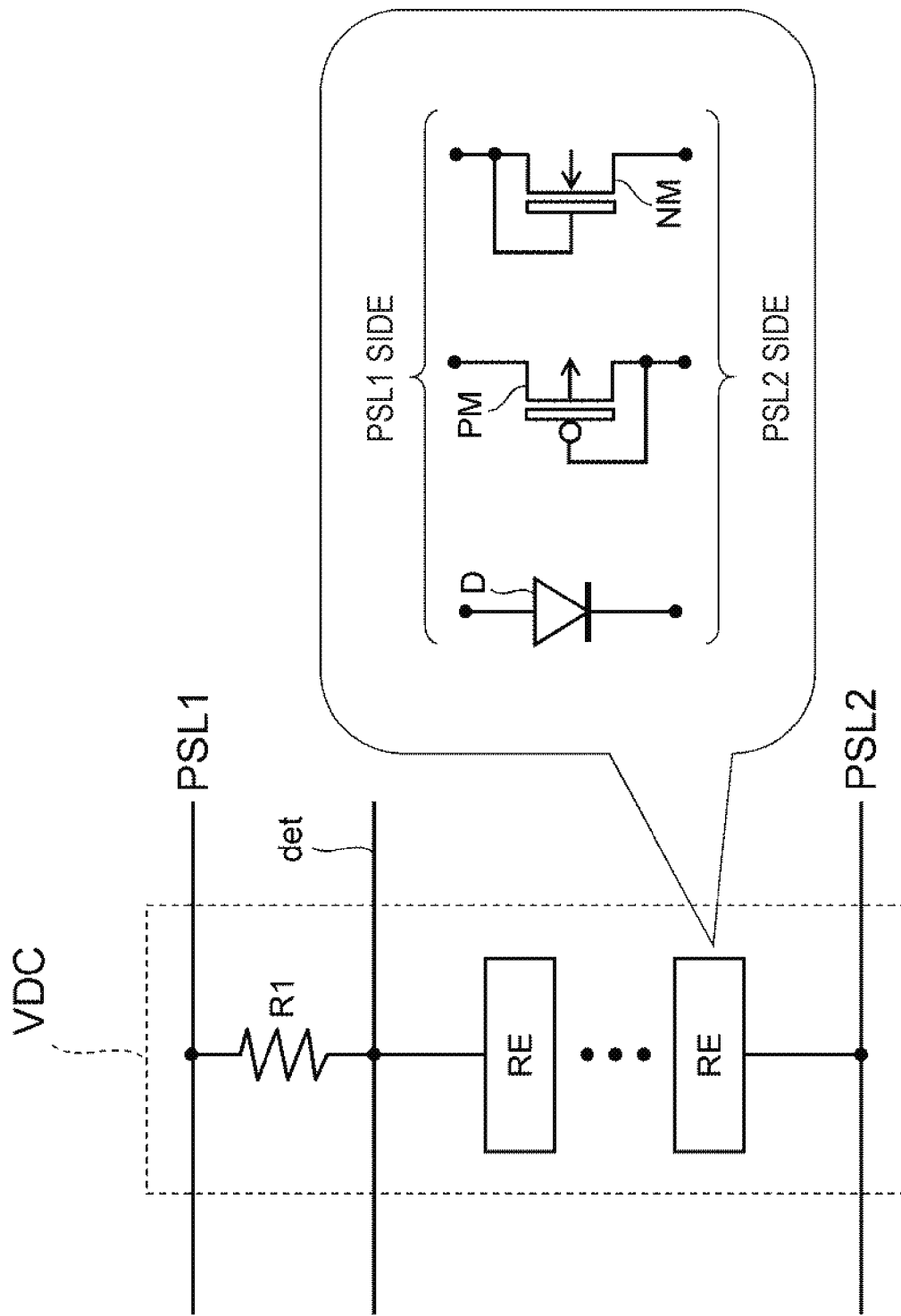
FIG. 9 is a circuit diagram showing an embodiment of a rectifying element RE.

FIG. 9 is a circuit diagram showing a specific example of the rectifying element RE. As shown in FIG. 9, a diode element D, a diode-connected PMOS transistor PM, a diode-connected NMOS transistor NM, and the like can be exemplified as the rectifying element RE. By using the diode-connected PMOS transistor PM and the diode-connected NMOS transistor NM, the rectifying function can be realized, and the rectifying element can be easily manufactured.

As shown in FIG. 9, the anodes of the diode elements D are connected to the first power supply line PSL1 side, and the cathodes of the diode elements D are connected to the second power supply line PSL2 side. The source of the PMOS transistor PM is connected to the first power supply line PSL1 side, and the drain of the PMOS transistor PM is connected to the second power supply line PSL2 side. The source of the NMOS transistor NM is connected to the second power supply line PSL2, and the drain of the NMOS transistor NM is connected to the first power supply line PSL1.

As shown in FIG. 8, the first amplifier circuit AMP1 includes a PMOS transistor PM2, a resistor R2, and a first output circuit OP1. The detection signal det outputted from the voltage detection circuit VDC is inputted to the gate of the PMOS transistor (second PMOS transistor) PM2, and the source of the PMOS transistor PM2 is connected to the first power supply line PSL1. That is, the magnitude of the source-gate voltage of the PMOS transistor PM2 is equal to the magnitude of the detection signal det. The drain of the PMOS transistor PM2 is connected to one end of the resistor R2. The other end of the resistor R2 is connected to the second power supply line PSL2. The connecting nodes of the drains of the PMOS transistor PM2 and the resistor R2 are connected to the inputs of the first output circuits OP1.

The first output circuit OP1 is an inverter circuit composed of a PMOS transistor PM11 and a NMOS transistor NM11. The gate of the PMOS transistor PM11 and the gate of the NMOS transistor NM11 are connected to each other, and their connecting nodes are inputs of the first output circuit OP1. The source of the PMOS transistor PM11 is connected to the first power supply line PSL1. The source of the NMOS transistor NM11 is connected to the second power supply line PSL2. The drain of the PMOS transistor PM11 and the drain of the NMOS transistor MN11 are connected to each other, and their connecting nodes are the output of the first output circuit OP1. The drive signal drv for driving the discharge elements DE is output from the first output circuit OP1.

As shown in FIG. 8, the second amplifier circuit AMP2 includes PMOS transistors PM3 and PM4, a resistor (second resistor) R3, and a second output circuit OP2. The detection signal det outputted from the voltage detection circuit VDC is inputted to the gate of the PMOS transistor (third PMOS transistor) PM3, and the source of the PMOS transistor PM3 is connected to the first power supply line PSL1. That is, the magnitude of the source-gate voltage of the PMOS transistor PM3 is equal to the magnitude of the detection signal det. The drain of the PMOS transistor PM3 is connected to one end of the resistor R3. The other end of the resistor R3 is connected to the second power supply line PSL2. The connecting node of the drains of the PMOS transistor PM3 and the resistor R3 is connected to the input of the second output circuit OP2.

The second output circuit OP2 is an inverter circuit composed of a PMOS transistor PM21 and a NMOS transistor NM21. The gate of the PMOS transistor PM21 and the gate of the NMOS transistor NM21 are connected to each other, and the connecting node is inputs of the second output circuit OP2. The source of the PMOS transistor PM21 is connected to the first power supply line PSL1. The source of the NMOS transistor NM21 is connected to the second power supply line PSL2. The drain of the PMOS transistor PM21 and the drain of the NMOS transistor MN21 are connected to each other, and the connecting node is the output of the second output circuit OP2.

The output of the second output circuit OP2 is connected to the gate of the PMOS transistor (fourth PMOS transistor) PM4. Source of the PMOS transistor PM4 is connected to gate of the PMOS transistor PM3, i.e., output of the voltage detection circuit VDC. The drain of the PMOS transistor PM4 is connected to the second power supply line PSL2. When the PMOS transistor PM4 is driven, the detection signal det is amplified. That is, the PMOS transistor PM4 is a booster. Note that the PMOS transistor PM4 may have a multi-stage vertical stacking configuration.

Figure 10:
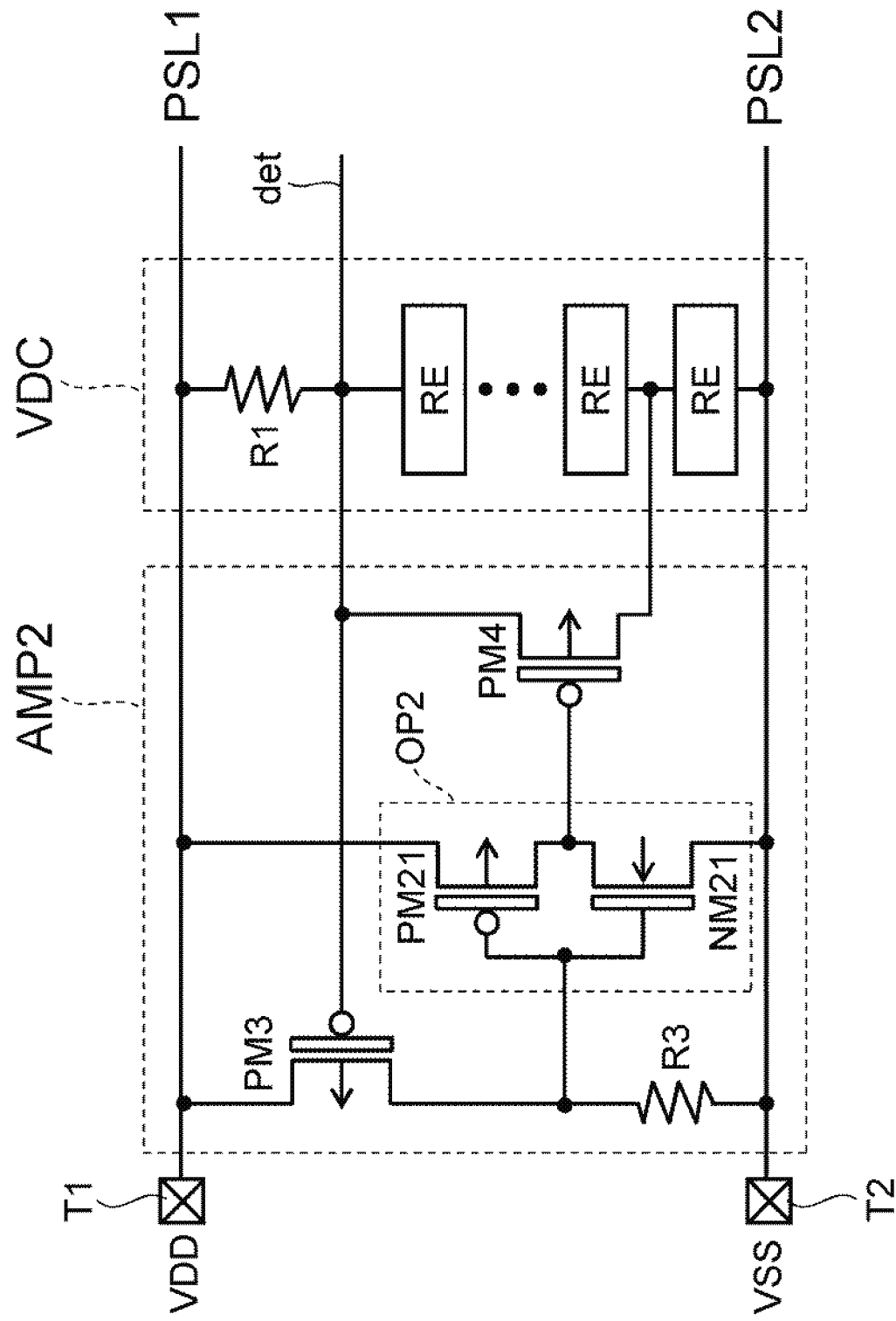
FIG. 10 is a circuit diagram showing variations of connections of sources and drains of a PMOS transistor PM4.
Figure 11:
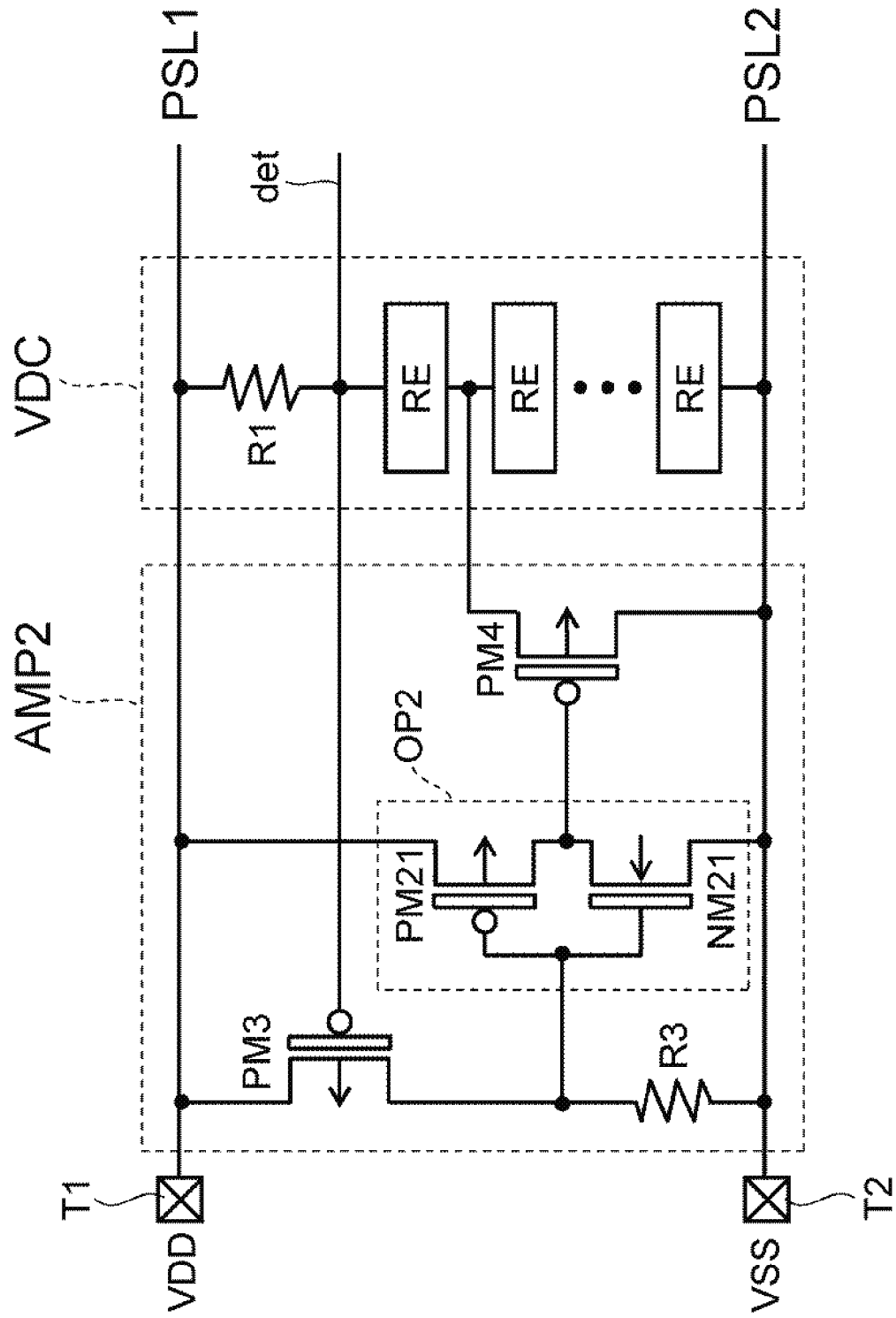
FIG. 11 is a circuit diagram showing variations of connections of sources and drains of a PMOS transistor PM4.
Figure 12:
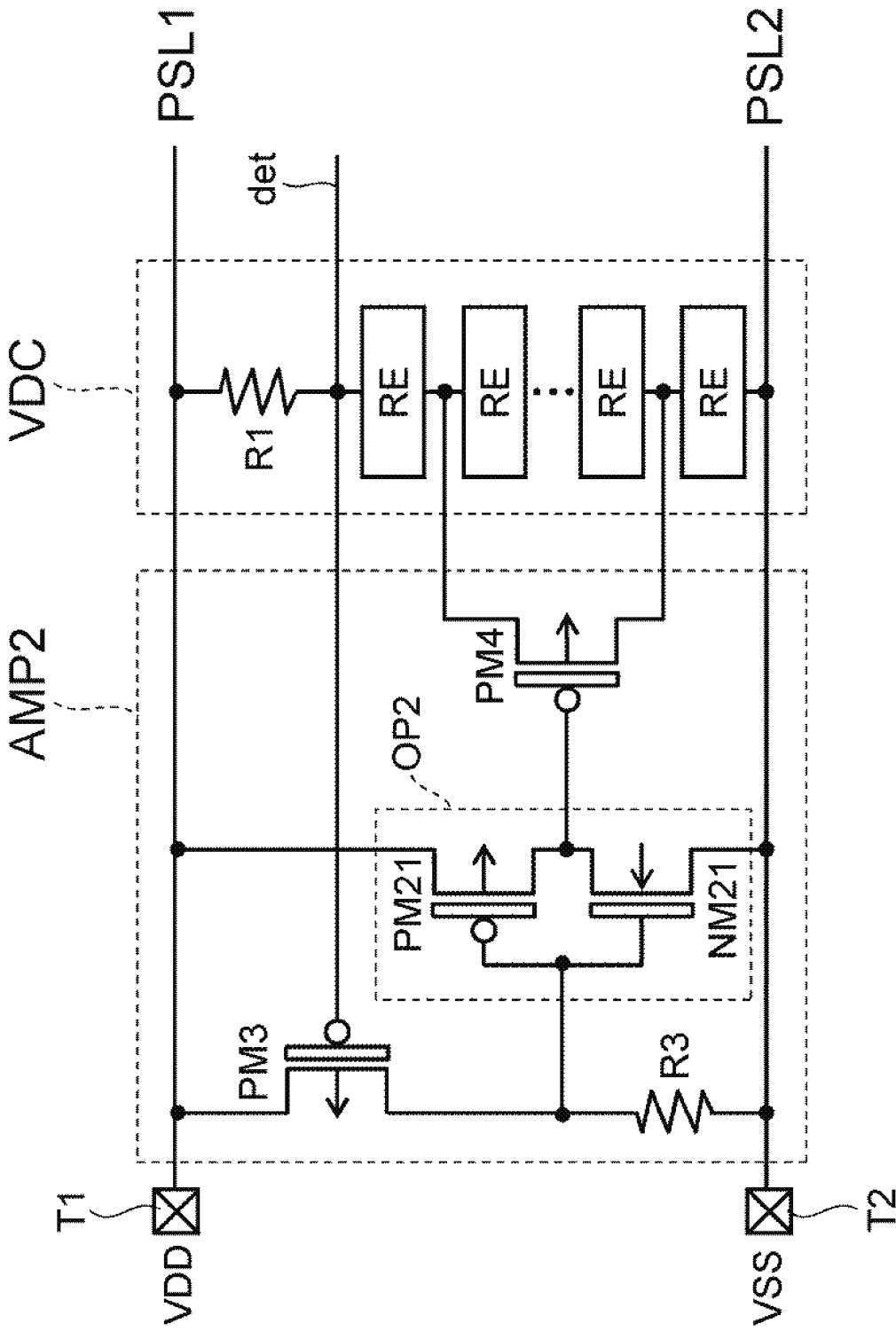
FIG. 12 is a circuit diagram showing variations of connections of sources and drains of a PMOS transistor PM4.

FIGS. 10 to 12 are circuit diagrams showing variations of the connection of the source and the connection of the drain of the PMOS transistor PM4. As shown in FIG. 10, the drain of the PMOS transistor PM4 may be connected to the connecting nodes of the rectifying elements REs of the voltage detection circuit VDC instead of the second power supply lines PSL2. As shown in FIG. 11, the source of the PMOS transistor PM4 may be connected to the connecting node of the rectifying elements REs of the voltage detection circuit VDC instead of the output of the voltage detection circuit VDC.

Further, as shown in FIG. 12, both the source and drain of the PMOS transistors PM4 may be connected to the connecting nodes of the rectifying elements REs of the voltage detection circuit VDC. As a matter of course, the source of the PMOS transistor PM4 is connected to higher potential than the drain.

Detailed Operation of Semiconductor Device

Figure 13:
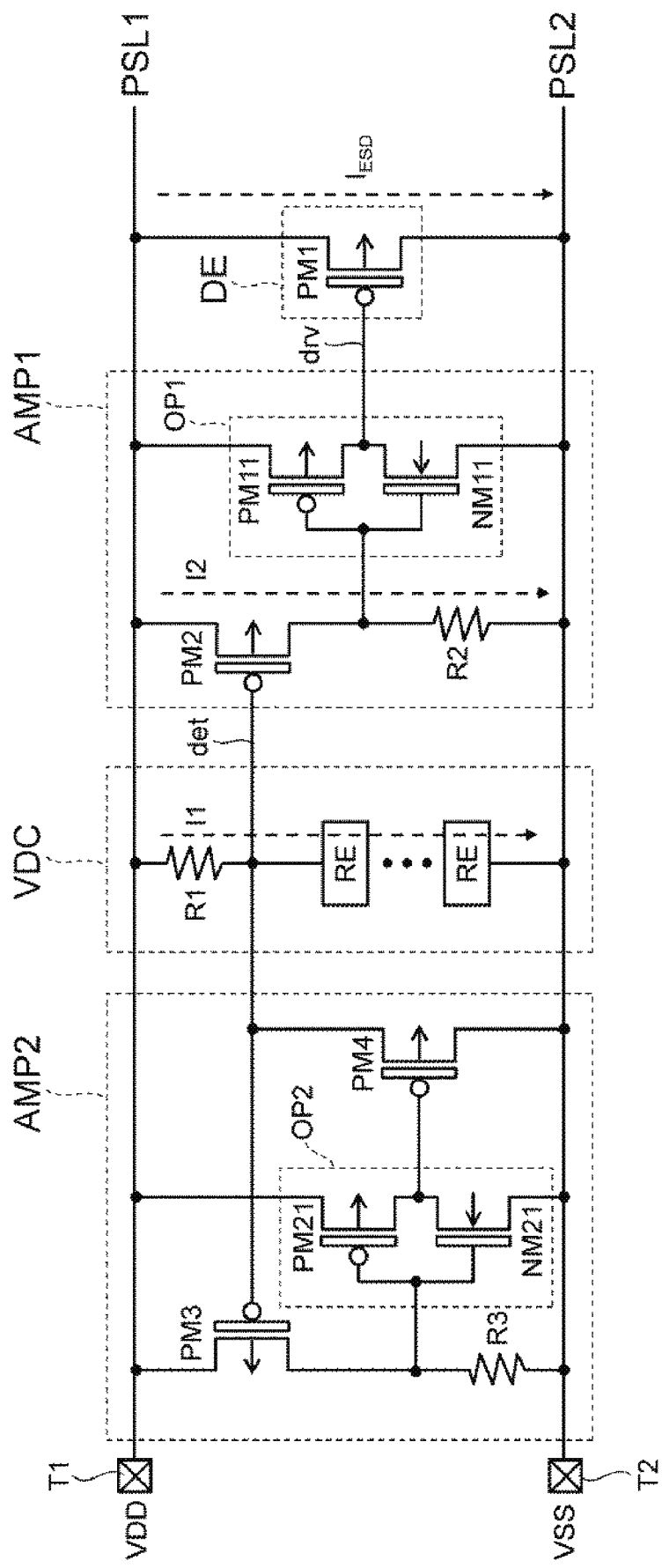
FIG. 13 is a circuit diagram showing the detailed operation of the semiconductor device according to the first embodiment.
Figure 14:
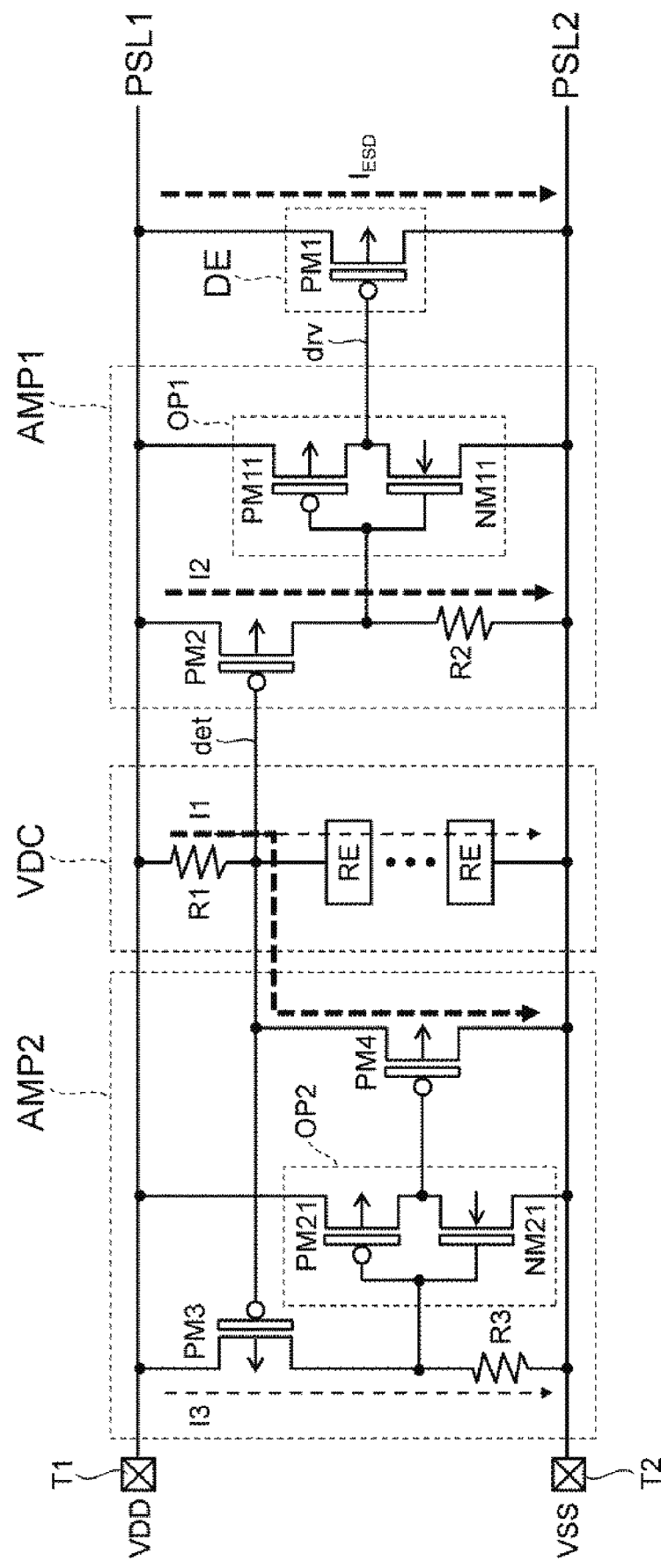
FIG. 14 is a circuit diagram showing the detailed operation of the semiconductor device according to the first embodiment.

Next, referring to FIGS. 13 and 14, the operation of the semiconductor device according to the first embodiment when noises are generated will be described in more detail. FIGS. 13 and 14 are circuit diagrams showing a detailed operation of the semiconductor device according to the first embodiment. Here, FIG. 13 and FIG. 14 are circuit diagrams shown in FIG. 8 to which current flows are written using broken line arrows.

FIG. 13 shows a state in which the inter-terminal voltage becomes equal to or higher than the operating voltage of the voltage detection circuit VDC, and only the first amplifier circuit AMP1 operates. FIG. 14 shows a state in which the second amplifier circuit AMP2 operates in addition to the first amplifier circuit AMP1. In the following description of the operation, in addition to FIG. 13 and FIG. 14, the flowchart of FIG. 5 is also referred to.

First, as shown in FIG. 13, since the voltage detection circuit VDC includes the rectifying element string, the detection current I1 does not flow through the resistor R1 if the inter-terminal voltage is less than a predetermined threshold (the operating voltage of the voltage detection circuit VDC) (step ST1NO in FIG. 5). Therefore, the detection signal det is not output from the connection node between the resistor R1 and the rectifying element string. The source-gate voltage of the PMOS transistor PM2 of the first amplifier circuit AMP1 is 0V, and the PMOS transistor PM2 is not driven. Therefore, the first amplifier AMP1 does not operate, and the discharge element DE is not driven (step ST2 in FIG. 5).

On the other hand, if the inter-terminal voltage is equal to or higher than the operating voltage of the voltage detection circuit VDC (step ST1YES in FIG. 5), the detection current I1 (current value i1) flows through the resistor R1 (resistor value r1) as shown in FIG. 13. Therefore, the detection signal det having the magnitude r1*i1 is outputted from the connecting node between the resistor R1 and the rectifying element string (step ST3 in FIG. 5). The magnitude of the detection signal det is the magnitude of the voltage across the resistor R1.

Until the second amplifier circuit AMP2 starts operating (step ST4NO in FIG. 5), the first amplifier circuit AMP1 amplifies the detection signal det as shown in FIG. 13 (step ST5 in FIG. 5). Specifically, the source-gate voltage of the PMOS transistor PM2 of the first amplifier circuit AMP1 are equal to the magnitude r1*i1 of the detection signal det. Therefore, as shown in FIG. 13, the PMOS transistor PM2 is driven, and a current I2 flows through the resistor R2. Accordingly, when the input voltage of the first output circuit OP1 rises from VSS and exceeds the threshold voltage of the first output circuit OP1, which is an inverter circuit, the drive signal dry is output from the first output circuit OP1.

The source-gate voltage of the PMOS transistor PM1, which is the discharge element DE, is increased by the drive signal dry outputted from the first amplifier circuit AMP1, and the PMOS transistor PM1 is driven (ST6 in FIG. 5).

That is, the PMOS transistor PM1 changes from the OFF state to the ON state, the discharge current IESD flows between the first terminal T1 and the second terminal T2, and the inter-terminal voltage is clamped (first clamp operation).

Next, when the second amplifier circuit AMP2 starts to operate (step ST4YES in FIG. 5), the second amplifier circuit AMP2 feedback-amplifies the detection signal det (step ST7 in FIG. 5). Specifically, the source-gate voltage of the PMOS transistor PM3 of the second amplifier circuit AMP2 is equal to the magnitude r1*i1 of the detection signals det. Therefore, as shown in FIG. 14, the PMOS transistor PM3 is driven, and the current I3 flows through the resistor R3. Accordingly, when the input voltage of the second output circuit OP2 rises from VSS and exceeds the threshold voltage of the second output circuit OP2, which is an inverter circuit, the PMOS transistor PM4 is driven by the output signal of the second output circuit OP2.

That is, the PMOS transistor PM4 changes from the OFF state to the ON state, and a current flows between the first terminal T1 and the second terminal T2 via the resistor R1 and the PMOS transistor PM4. As a result, the detection current I1 flowing through the resistor R1 increases, and the detection signal det increases.

If the size of PMOS transistor PM3 is reduced or the resistance value of the resistor R3 is reduced, the input voltage of the second output circuit OP2 is reduced. That is, in order to start the operation of the second amplifier AMP2, a larger inter-terminal voltage or a larger discharge current IESD is required. Therefore, if the size of the PMOS transistor PM3 is made smaller than the size of the PMOS transistor PM2, or if the resistance value of the resistor R3 is made smaller than the resistance value of the resistor R2, the input voltage of the second output circuit OP2 becomes smaller than the input voltage of the first output circuit OP1 under the same inter-terminal voltage or discharge current IESD. That is, the second amplifier circuit AMP2 starts the operation when the inter-terminal voltage or the discharge current IESD becomes larger than the inter-terminal voltage or the discharge current required to start the operation of the first amplifier circuit AMP1. Conversely, when the size of PMOS transistor PM3 is increased or the resistance value of the resistor R3 is increased, the input voltage of the second output circuit OP2 is increased. That is, voltages or currents required for starting the operation of the second amplifier circuit AMP2 can be reduced. In this manner, by appropriately setting the sizes of the PMOS transistors PM3 and the resistance value of the resistor R3, voltages or currents required for starting the operation of the second amplifier circuits AMP2 can be set to desired values.

Next, the first amplifier circuit AMP1 amplifies the detection signal det amplified by the second amplifier circuit AMP2 (ST8 in FIG. 5). Specifically, as shown in FIG. 14, the PMOS transistor PM2 is driven more strongly by the amplified detection signal det, and the current I2 flowing through the resistor R2 increases. Accordingly, the drive signal dry output from the first output circuit OP1 also increase.

As a result, the source-gate voltage of the PMOS transistor PM1, which is the discharge element DE, increases, and the PMOS transistor PM1 is driven more strongly in ST9 of FIG. 5. That is, the PMOS transistor PM1 is turned on more strongly, and the discharge current IESD increases as shown in FIG. 14. Therefore, the inter-terminal voltage is clamped to a voltage lower than that of the first clamp operation (second clamp operation). Here, the clamp voltage in the second clamp operation can be adjusted according to the size of the PMOS transistor PM4. More specifically, when the size of the PMOS transistor PM4 is increased, the clamp voltage in the second clamp operation can be reduced.

In the semiconductor device according to the first embodiment, the clamp voltage can be lowered by the operation of the second amplifier circuits AMP2. Therefore, as shown in FIG. 6, the margin of the operation voltage Vo of the voltage detection circuit VDC with respect to the power supply voltage VDD and the margin of the clamp voltage with respect to the breakdown withstand voltage of the internal circuit can be made compatible with each other. The second amplifier circuit AMP2 starts operating separately from the first amplifier circuit AMP1. Therefore, as shown in FIG. 7, the voltage or current required for starting the operation of the second amplifier AMP2 can be adjusted, and the clamp voltage at the time of the first clamp operation and at the time of the second clamp operation can be easily adjusted to appropriate ranges.

Although FIG. 6 shows a case where the second amplifier circuit AMP2 starts to operate later than the first amplifier circuit AMP1, the voltage or current required to start the operation of the second amplifier circuit AMP2 may be the same as the voltage or current required to start the operation of the first amplifier circuit AMP1 if the clamp voltage in the second clamp operation is not lower than the power supply voltage VDD. In this instance, the sizes of the PMOS transistors PM2 and PM3, the resistance values of the resistors R2 and R 3, and the characteristics of the first output circuit OP1 and the second output circuit OP2 may be set equal to each other.

Modified Example of First Embodiment

Figure 15:
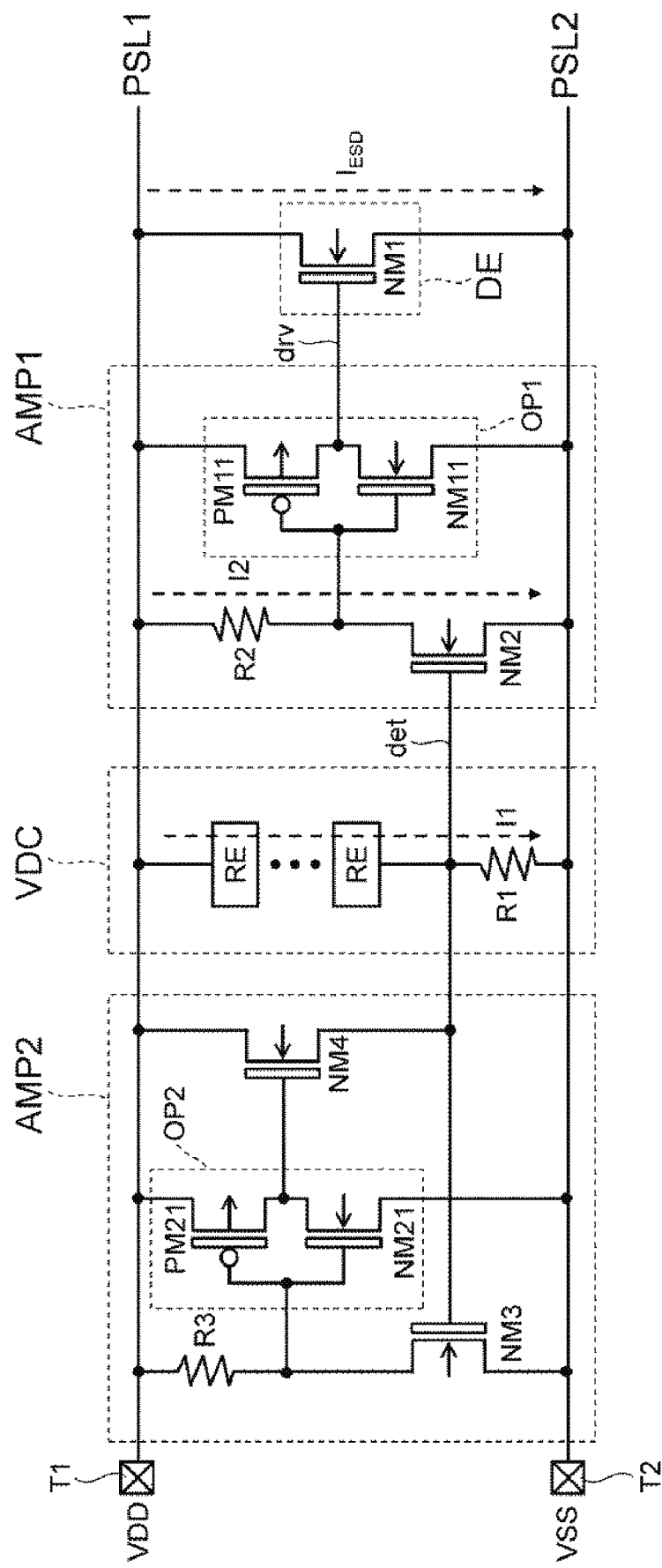
FIG. 15 is a circuit diagram of a semiconductor device according to a modified example according to a first embodiment.
Figure 16:
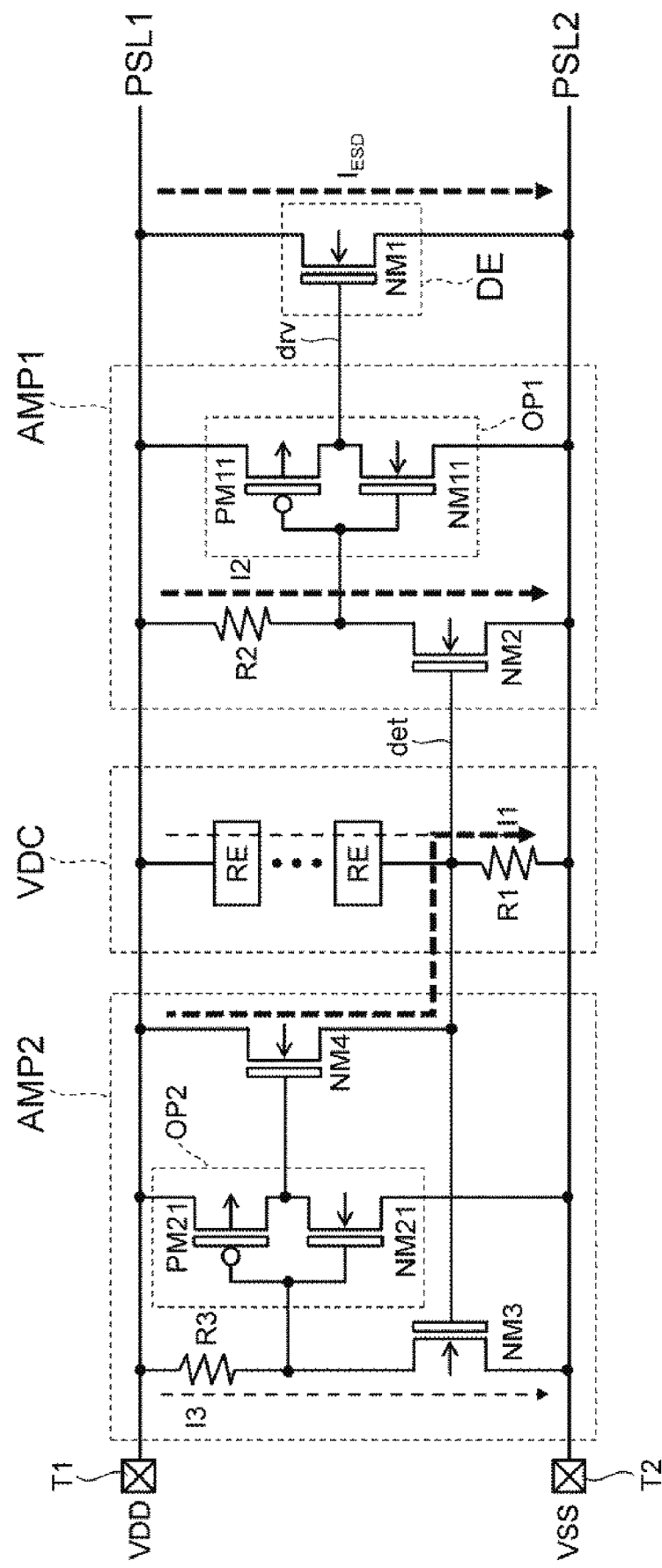
FIG. 16 is a circuit diagram of a semiconductor device according to a modified example according to a first embodiment.

Next, referring to FIGS. 15 and 16, a semiconductor device according to the modified example of the first embodiment will be described. FIGS. 15 and 16 are circuit diagrams of the semiconductor device according to the modified example of the first embodiment. Here, FIG. 15 and FIG. 16 are the same circuit diagrams to which the flow of current is written using a broken line arrow. FIG. 15 shows a state in which the voltage between the terminals becomes equal to or higher than the operating voltage of the voltage detecting circuit VDC, and only the first amplifier circuit AMP1 operates. FIG. 16 shows a state in which the second amplifier circuit AMP2 operates in addition to the first amplifier circuit AMP1.

The discharge element DE of the semiconductor device shown in FIG. 8 is composed of a PMOS transistor PM1. On the other hand, the discharge element DE of the semiconductor device according to the modified example shown in FIG. 15 is composed of a NMOS transistor NM1. Accordingly, in the semiconductor device according to the modified example, the first amplifier AMP1 includes a NMOS transistor NM2 instead of the PMOS transistor PM2. The second amplifier circuit AMP2 includes NMOS transistors NM3 and NM4 instead of the PMOS transistors PM3 and PM4. Discuss in detail below The NMOS transistor (first NMOS transistor) NM1 constituting the discharge element DE is, for example, a large-sized transistor having a total gate width W of several hundred to several thousand gate widths. The source of the NMOS transistor NM1 is connected to the second power supply line PSL2, and the drain of the NMOS transistor NM1 is connected to the first power supply line PSL1. The drive signal dry outputted from the first amplifier circuit AMP1 are inputted to the gate of the NMOS transistor NM1. Based on the drive signal dry, the NMOS transistor NM1 changes from the OFF state to the ON state, and a discharge current IESD flows between the first terminal T1 and the second terminal T2.

As shown in FIG. 15, in the voltage detection circuit VDC of the semiconductor device according to the modified example, one end of the resistor R1 is connected to the second power supply line PSL2, and one end of the rectifying element string is connected to the first power supply line PSL1. A detection signal det is output from a connection node between the resistor R1 and the rectifying element string. When the voltage between the first terminal T1 and the second terminal T2 reaches a predetermined threshold value exceeding the power supply voltage VDD, i.e., the operating voltage of the voltage detection circuit VDC, a current flow through the rectifying element RE, and a detection signal det is output. The magnitude of the detection signal det is the magnitude of the voltage across the resistor R1. In modified example, the rectifying element RE constituting the rectifying element string is as shown in FIG. 9.

The first amplifier circuit AMP1 includes a NMOS transistor NM2, a resistor R2, and a first output circuit OP1. The detection signal det outputted from the voltage detection circuit VDC is inputted to the gate of the NMOS transistor (second NMOS transistor) NM2, and the source of the NMOS transistor NM2 is connected to the second power supply line PSL2. That is, the magnitude of the gate-source voltage of the NMOS transistors NM2 is equal to the magnitude of the detection signals det.

The drain of the NMOS transistor NM2 is connected to one end of the resistor R2. The other end of the resistor R2 is connected to the first power supply line PSL1. The connecting node of the drain of the NMOS transistor NM2 and the resistor R2 is connected to the input of the first output circuit OP1. The configuration of the first output circuit OP1 is the same as that of the first output circuit shown in FIG. 8. The drive signal dry for driving the discharge element DE are output from the first output circuit OP1.

The second amplifier circuit AMP2 includes NMOS transistors NM3 and NM4, a resistor R3, and a second output circuit OP2. The detection signal det outputted from the voltage detection circuit VDC is inputted to the gate of the NMOS transistor (third NMOS transistor) NM3, and the source of the NMOS transistor NM3 is connected to the second power supply line PSL2. That is, the magnitude of the gate-source voltage of the NMOS transistors NM3 is equal to the magnitude of the detection signal det. The drain of the NMOS transistor NM3 is connected to one end of the resistor R3. The other end of the resistor R3 is connected to the second power supply line PSL2. The connecting node of the drain of the NMOS transistor NM3 and the resistor R3 are connected to the input of the second output circuit OP2.

The configuration of the second output circuit OP2 is the same as that of the second output circuit shown in FIG. 8. The output of the second output circuit OP2 is connected to the gate of the NMOS transistor (fourth NMOS transistor) NM4. Source of the NMOS transistor NM4 is connected to gate of the NMOS transistor NM3, i.e., outputs of the voltage-detecting circuit VDC. The drain of the PMOS transistor PM4 is connected to the second power supply lines PSL2. When the NMOS transistor NM4 is driven, the detected signal det is amplified. That is, the NMOS transistor NM4 is a booster. Note that the NMOS transistor NM4 may have a multi-stage vertical stacking configuration.

Operation of Modified Example of the First Embodiment

Next, referring to FIGS. 15 and 16, the operation of the semiconductor device according to the modified example of the first embodiment when noises are generated will be described in detail. In the following description of the operation, in addition to FIG. 15 and FIG. 16, the flowchart of FIG. 5 is also referred to.

First, as shown in FIG. 15, since the voltage detection circuit VDC includes the rectifying element string, the detection current I1 does not flow through the resistor R1 if the inter-terminal voltage is less than a predetermined threshold (the operating voltage of the voltage detection circuit VDC) (step ST1NO in FIG. 5). Therefore, the detection signal det is not output from the connection node between the resistor R1 and the rectifying element string. The gate-source voltage of the NMOS transistors NM2 of the first amplifier circuit AMP1 are 0V, and the NMOS transistor NM2 is not driven. Therefore, the first amplifier circuit AMP1 does not operate, and the discharge element DE is not driven (ST2 in FIG. 5).

On the other hand, when the inter-terminal voltage is equal to or higher than the operating voltage of the voltage detection circuit VDC (step ST1YES in FIG. 5), as shown in FIG. 15, the detection current I1 (current value i1) flows through the resistor R1 (resistor value r1). Therefore, the detection signal det having the magnitude r1*i1 is outputted from the connecting node between the resistor R1 and the rectifying element string (step ST3 in FIG. 5). The magnitude of the detection signal det is the magnitude of the voltage across the resistor R1.

Until the second amplifier circuit AMP2 starts operating (step ST4NO in FIG. 5), the first amplifier circuit AMP1 amplifies the detection signal det as shown in FIG. 15 (step ST5 in FIG. 5). Specifically, the gate-source voltage of the NMOS transistor NM2 of the first amplifier circuit AMP1 is equal to the magnitude r1*i1 of the detection signal det. Therefore, as shown in FIG. 15, the NMOS transistor NM2 is driven, and a current I2 flows through the resistor R2. Accordingly, when the input voltage of the first output circuit OP1 drops from the voltage of the first terminal T1 and exceeds the threshold value of the first output circuit OP1, which is an inverter circuit, the drive signal drv is output from the first output circuit OP1.

The gate-source voltage of the NMOS transistor NM1, which is the discharge element DE, are increased by the drive signal drv outputted from the first amplifier circuit AMP1, and the NMOS transistor NM1 is driven (ST6 in FIG. 5). That is, the NMOS transistor NM1 changes from the OFF state to the ON state, the discharge current IESD flows between the first terminal T1 and the second terminal T2, and the inter-terminal voltage is clamped (first clamp operation).

Next, when the second amplifier circuit AMP2 starts to operate (step ST4YES in FIG. 5), the second amplifier circuit AMP2 feedback-amplifies the detection signal det (step ST7 in FIG. 5). Specifically, the gate-source voltage of the NMOS transistor NM3 of the second amplifier circuit AMP2 is equal to the magnitude r1*i1 of the detection signal det. Therefore, as shown in FIG. 16, the NMOS transistor NM3 is driven, and the current I3 flows through the resistor R3. Accordingly, when the input voltage of the second output circuit OP2 drops from the voltage of the first terminal T1 and exceeds the threshold value of the second output circuit OP2, which is an inverter circuit, the NMOS transistor NM4 is driven by the output signal of the second output circuit OP2.

That is, the NMOS transistor NM4 changes from the OFF state to the ON state, and a current flow between the first terminal T1 and the second terminal T2 via the resistor R1 and the NMOS transistor NM4. As a result, the detection current I1 flowing through the resistor R1 increases, and the detection signal det increases.

If the NMOS transistor NM3 is reduced or the resistance of the resistor R3 is reduced, the input voltage of the second output circuit OP2 is reduced. That is, in order to start the operation of the second amplifier circuit AMP2, a larger inter-terminal voltage or a larger discharge current IESD is required. Therefore, if the size of the NMOS transistor NM3 is made smaller than that of the NMOS transistor NM2, or if the resistance value of the resistor R3 is made smaller than the resistance value of the resistor R2, the input voltage of the second output circuit OP2 can be made smaller than the input voltage of the first output circuit OP1. As a result, the second amplifier circuit AMP2 can start the operation when the inter-terminal voltage or the discharge current becomes larger than the inter-terminal voltage or the discharge current required to start the operation of the first amplifier circuit AMP1. Conversely, when the size of the NMOS transistor NM3 is increased or the resistance of the resistor R3 is increased, the input voltage of the second output circuit OP2 is increased. That is, voltages or currents required for starting the operation of the second amplifier circuit AMP2 can be reduced.

In step ST8, the first amplifier circuit AMP1 amplifies the detection signal det amplified by the second amplifier circuit AMP2. Specifically, as shown in FIG. 16, the NMOS transistor NM2 is driven more strongly by the amplified detection signal det, and the current I2 flowing through the resistor R2 increases. Accordingly, the drive signal drv output from the first output circuit OP1 also increase.

As a result, the gate-source voltage of the NMOS transistor NM1, which is the discharge element DE, increases, and the NMOS transistor NM1 is driven more strongly in step ST9. That is, the NMOS transistor NM1 is turned on more strongly, and the discharge current IESD increases as shown in FIG. 16. Therefore, the inter-terminal voltage is clamped to a voltage lower than that of the first clamp operation (second clamp operation). Here, the clamp voltages in the second clamp operation can be adjusted according to the size of the NMOS transistor NM4. More specifically, when the size of the NMOS transistor NM4 is increased, the clamp voltage in the second clamp operation can be reduced.

Also in the semiconductor device according to the modified example of the first embodiment, the clamp voltage can be lowered by the operation of the second amplifier circuits AMP2. Therefore, as shown in FIG. 6, the margin of the operation voltage Vo of the voltage detection circuit VDC with respect to the power supply voltage VDD and the margin of the clamp voltage with respect to the breakdown withstand voltage of the internal circuit can be made compatible with each other. Further, the second amplifier circuit AMP2 starts to operate separately after a delay from the first amplifier circuit AMP1. Therefore, as shown in FIG. 7, the voltage or current required for starting the operation of the second amplifier circuit AMP2 can be adjusted, and the clamp voltage at the time of the first clamp operation and at the time of the second clamp operation can be easily adjusted to appropriate range.

Second Embodiment

Configuration of Semiconductor Device

Figure 17:
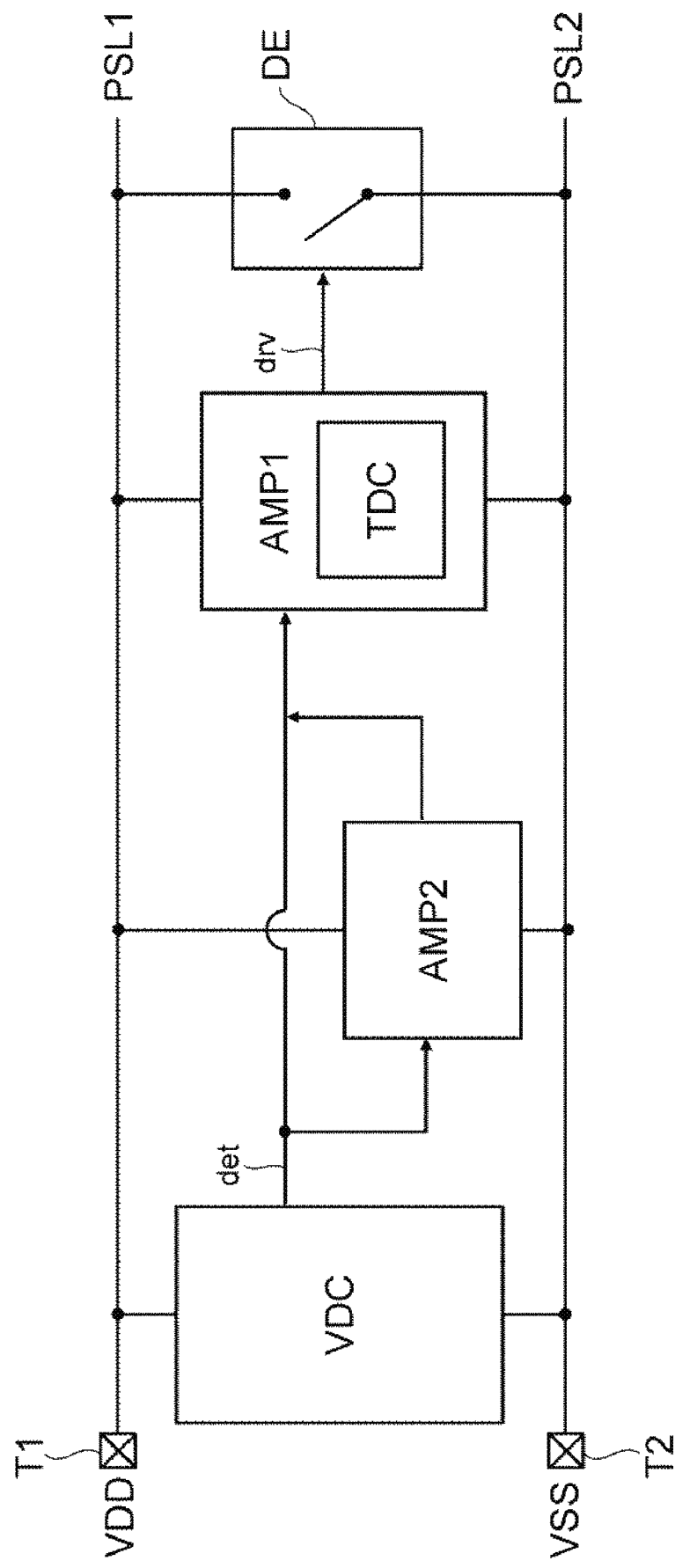
FIG. 17 is a block diagram showing the configuration of a semiconductor device according to a second embodiment.

Next, referring to FIG. 17, a semiconductor device according to the second embodiment will be described. FIG. 17 is a diagram showing a configuration of a semiconductor device according to the second embodiment. As shown in FIG. 17, the semiconductor device according to the second embodiment is a voltage-triggered and RC-triggered electrostatic protection circuit including a transient detection circuit TDC in the first amplifier circuit AMP1 of the semiconductor device according to the first embodiment.

The first amplifier circuit AMP1 amplifies the inputted detection signal det and outputs a drive signal dry for driving the discharge element DE, similarly to the semiconductor device according to the first embodiment. In addition, the first amplifier circuit AMP1 amplifies an output signal of the transient detection circuit TDC and outputs a drive signal dry for driving the discharge element DE. The discharge element DE is driven based on the drive signal dry, the state of the discharge element DE changes from the OFF state to the ON state, and the discharge current IESD flows between the first terminal T1 and the second terminal T2. As a result, the voltage between the terminals is clamped.

When an ESD noise having a sharp rise occurs, the output signal of the transient detection circuit TDC reaches a predetermined threshold value, i.e., the operating voltage of the first amplifier circuit AMP1, and the first amplifier circuit AMP1 operates before the voltage detection circuit VDC operates.

On the other hand, when EMS noise occurs with a slow rise, the output signal of the transient detection circuit TDC does not reach the operating voltage of the first amplifier circuit AMP1. Therefore, similarly to the semiconductor device according to the first embodiment, the first amplifier circuit AMP1 amplifies the detection signal det outputted from the voltage detection circuit VDC. Since the rest of the configuration is the same as that of the semiconductor device according to the first embodiment, the explanation thereof is omitted.

Operation of Semiconductor Device

Figure 18:
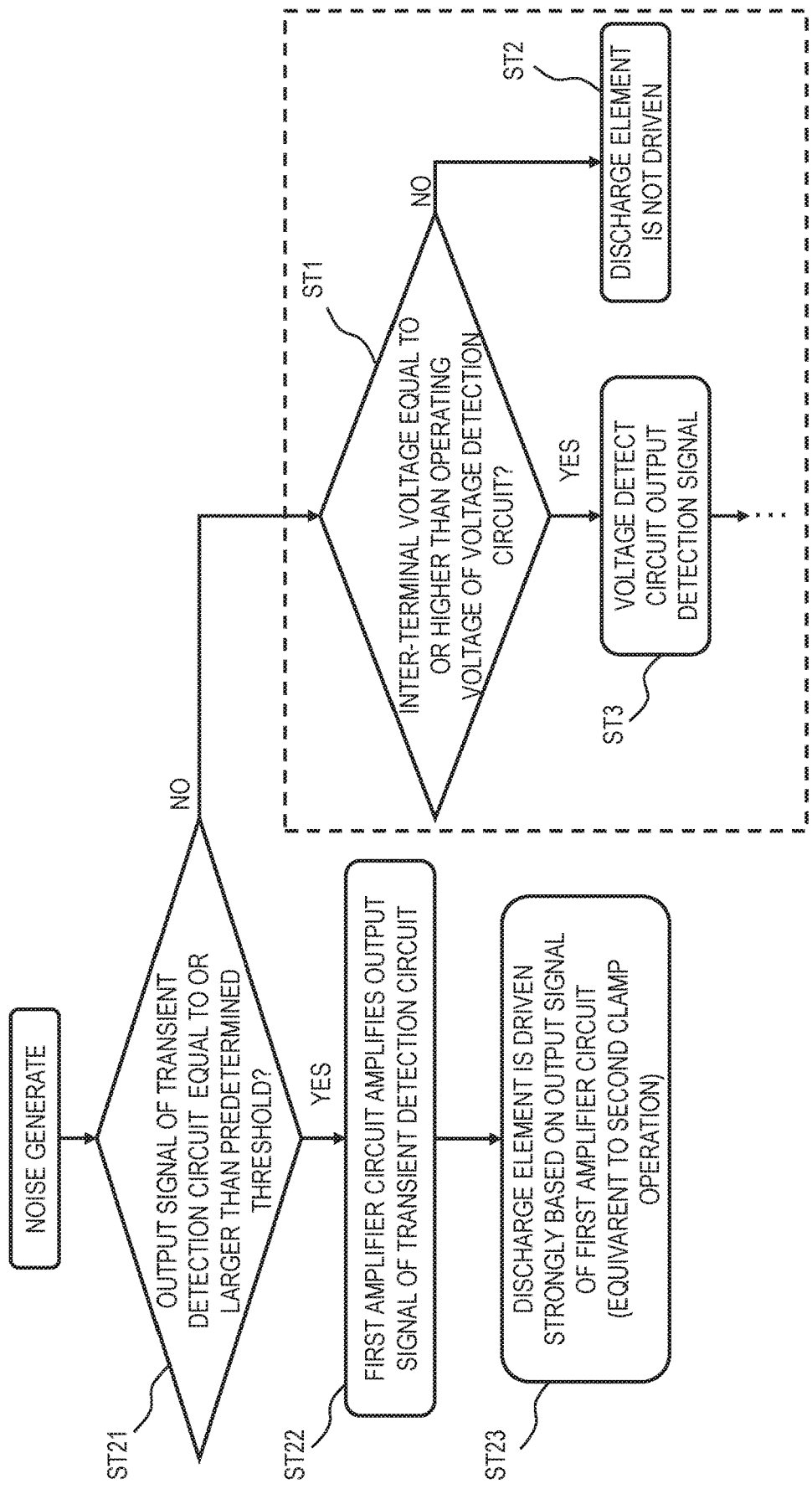
FIG. 18 is a flow chart showing the operation when noise is generated in the semiconductor device according to the second embodiment.

Next, referring to FIG. 18, the operation of the semiconductor device according to the second embodiment at the time of generation of noises will be described. FIG. 18 is a flow chart showing the operation of the semiconductor device according to the second embodiment when noises are generated.

As shown in FIG. 18, when the noise generated between the terminals is an ESD noise having a sharp rise, the output signal of the transient detection circuit TDC becomes equal to or larger than a predetermined threshold (step ST21YES), and the output signal of the transient detection circuit TDC is amplified (step ST22). In ST23, the discharge element DE is driven based on the drive signal dry outputted from the first amplifier circuit AMP1.

That is, the discharge element DE changes from the OFF state to the ON state, the discharge current IESD flows between the first terminal T1 and the second terminal T2, and the voltage between the terminals is clamped. As described above, the output signal of the transient detection circuit TDC is equivalent to the detection signal det amplified by the second amplifier circuit AMP2. Therefore, the discharge element DE is strongly driven, and the clamp voltage becomes equal to the clamp voltage at the time of the second clamp operation.

On the other hand, if the noise generated between the terminals is EMS noise with a slow rise, the output signal of the transient detection circuit TDC becomes less than a predetermined threshold value (step ST21NO), and the semiconductor device operates in the same manner as in steps ST1 to ST9 shown in FIG. 5 as indicated by a broken line in FIG. 18. Therefore, detailed description is omitted.

Figure 19:
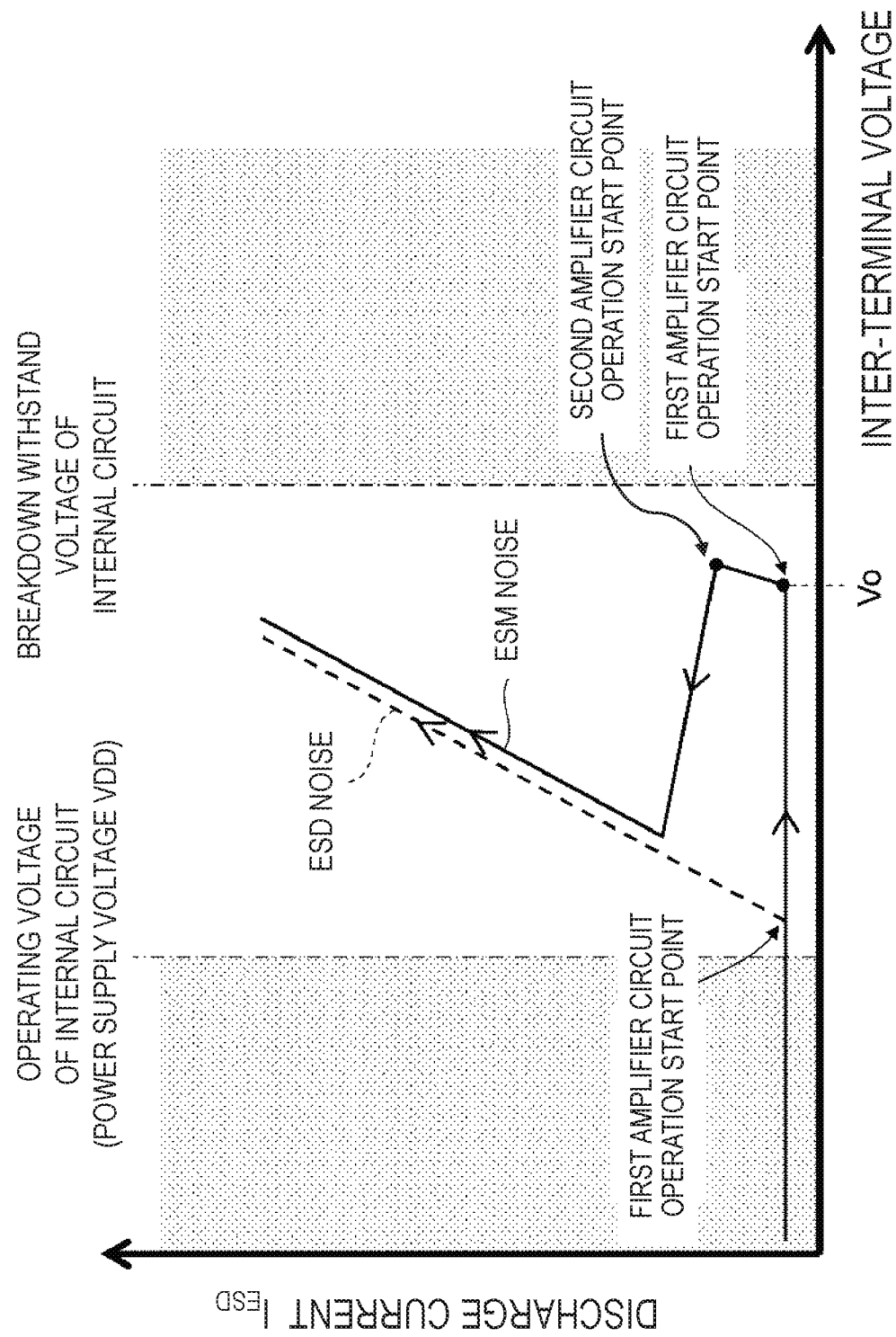
FIG. 19 is a graph showing the discharge characteristics of the semiconductor device according to the second embodiment.

Here, FIG. 19 is a graph showing the discharging characteristics of the semiconductor device according to the second embodiment. In FIG. 19, the horizontal axis represents the voltage between the first terminal T1 and the second terminal T2, and the vertical axis represents the discharge current IESD. In FIG. 19, the operating voltage of the internal circuit, i.e., the power supply voltage VDD, and the breakdown withstand voltage of the internal circuit are indicated by a dashed-dotted line. When EMS noise with a slow rise occurs between the terminals, as shown by the solid line in FIG. 19, the semiconductor device exhibits the same discharging characteristics as those of the semiconductor device according to the first embodiment, and therefore detailed descriptions thereof are omitted.

On the other hand, when an ESD noise having a sharp rise occurs between the terminals, the first amplifier circuit AMP1 starts to operate and the discharge element DE is driven prior to the operation of the voltage detecting circuit VDC, as indicated by a broken line in FIG. 19. That is, the discharge element DE changes from the OFF state to the ON state, the discharge current IESD starts to flow between the first terminal T1 and the second terminal T2, and the voltage between the terminals is clamped.

Here, as described above, the output signal of the transient detection circuit TDC is equivalent to the detection signal det amplified by the second amplifier circuit AMP2. Therefore, the discharge element DE is strongly driven, and the clamp voltage becomes equal to the clamp voltage at the time of the second clamp operation. As described above, in the semiconductor device according to the second embodiment, the clamp voltage at the time of generation of ESD noise can be made smaller than the clamping voltage semiconductor device according to the first embodiment.

The reason why the output signal of the transient detection circuit TDC becomes equal to or higher than a predetermined threshold value is when the inter-terminal voltage rises rapidly from the power supply voltage VDD due to ESD noise. Therefore, the inter-terminal voltage when the first amplifier AMP1 starts to operate does not fall below the power supply voltage VDD.

Detailed Configuration of Semiconductor Device

Figure 20:
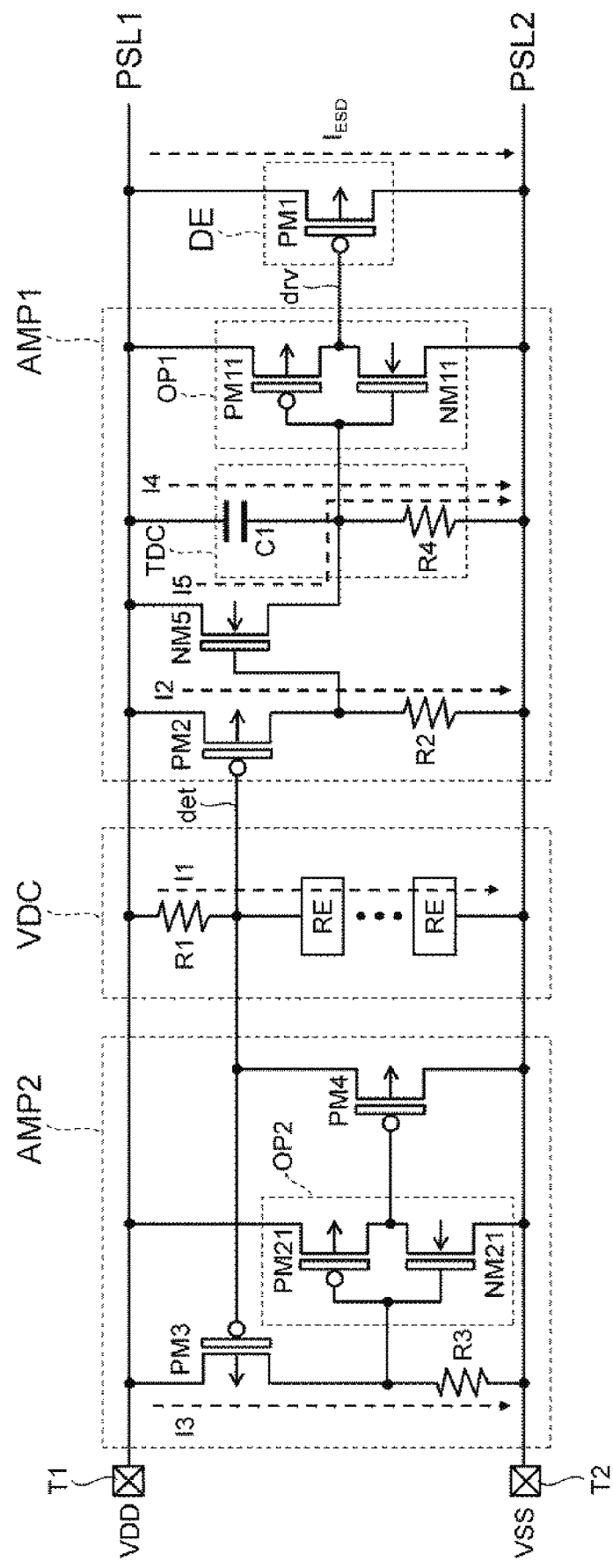
FIG. 20 is a circuit diagram showing a detailed configuration of a semiconductor device according to a second embodiment.

Next, referring to FIG. 20, the semiconductor device according to the second embodiment will be described in more detail. FIG. 20 is a circuit diagram showing a detailed configuration of the semiconductor device according to the second embodiment. That is, FIG. 20 shows a specific circuit configuration of the semiconductor device shown in FIG. 17.

As shown in FIGS. 17 and 20, the semiconductor device according to the second embodiment includes a discharge element DE, a voltage detection circuit VDC, a first amplifier circuit AMP1, and a second amplifier circuit AMP2. The first amplifier circuit AMP1 includes a transient detection circuit TDC. Here, the configuration other than the first amplifier circuit AMP1 is the same as that of the semiconductor device according to the first embodiment shown in FIG. 8, and therefore detailed descriptions thereof are omitted.

As shown in FIG. 20, the first amplifier circuit AMP1 includes a transient detection circuit TDC and a NMOS transistor NM5 in addition to the PMOS transistor PM2, the resistor R2, and the first output circuit OP1 shown in FIG. 8.

The detection signal det outputted from the voltage detection circuit VDC is inputted to the gate of the PMOS transistor PM2, and the source of the PMOS transistor PM2 is connected to the first power supply line PSL1. That is, the magnitude of the source-gate voltage of the PMOS transistor PM2 is equal to the magnitude of the detection signal det. The drain of the PMOS transistor PM2 is connected to one end of the resistor R2. The other end of the resistor R2 is connected to the second power supply line PSL2.

The connecting nodes of the drain of the PMOS transistor PM2 and the resistor R2 is connected to the gate of the NMOS transistor NM5. The drain of the NMOS transistor NM5 is connected to the first power supply lines PSL1, and the source of the NMOS transistor NM5 is connected to the input of the first output circuit OP1. The configuration of the first output circuit OP1 is the same as that of the first output circuit shown in FIG. 8. The drive signal dry for driving the discharge elements DE are output from the first output circuit OP1.

The transient detection circuit TDC is an RC circuit including a capacitor C1 and a resistor R4 connected in series between the first terminal T1 and the second terminal T2. One end of the capacitor C1 is connected to the first power supply line PSL1, and one end of the resistor R4 is connected to the second power supply line PSL2. A node between the other end of the capacitor C1 and the other end of the resistor R4 is an output node of the transient detection circuit TDC, and the node is connected to an input of the first output circuit OP1.

Detailed Operation of Semiconductor Device

Next, referring to FIG. 20, the operation of the semiconductor device according to the second embodiment at the time of generation of noises will be described in more detail. In the following description of the operation, reference is made to the flowchart of FIG. 18 in addition to FIG. 20.

First, when an ESD noise having a sharp rise occurs between the terminals, a transient current I4 flows through the capacitor C1 and the resistor R4 of the transient detection circuit TDC. Therefore, when the voltage of the output of the transient detection circuit TDC rises from VSS and exceeds the threshold value of the first output circuit OP1, which is the inverter circuit, in step ST21YES of FIG. 18, the drive signal dry is output from the first output circuit OP1. In other words, the first amplifier circuit AMP1 amplifies the output signal of the transient detection circuit TDC (ST22 in FIG. 18).

The source-gate voltage of the PMOS transistor PM1, which is the discharge elements DE, is increased by the drive signal dry outputted from the first amplifier circuit AMP1, and the PMOS transistor PM1 is driven (ST23 in FIG. 18). That is, the PMOS transistor PM1 changes from the OFF state to the ON state, the discharge current IESD flows between the first terminal T1 and the second terminal T2, and the voltages between the terminals are clamped.

As described above, the output signal of the transient detection circuit TDC is equivalent to the detection signal det amplified by the second amplifier circuit AMP2. Therefore, the discharge element DE is strongly driven, and the clamp voltage becomes equal to the clamp voltage at the time of the second clamp operation. As described above, the semiconductor device according to the second embodiment further includes the transient detecting circuit TDC in which the first amplifier circuit AMP1 is a simple RC circuit. Therefore, the clamp voltage at the time of generation of the ESD noise can be made smaller than the clamp voltage of the semiconductor device according to the first embodiment.

On the other hand, when the noise generated between the terminals is EMS noise with a slow rise, the output signal of the transient detection circuit TDC becomes less than a predetermined threshold value (ST21NO in FIG. 18). In this instance, as shown in FIG. 18, the semiconductor device according to the second embodiment also operates in the same manner as the semiconductor device according to the first embodiment. That is, the first amplifier circuit AMP1 amplifies not the output signal of the transient detection circuit TDC but the detection signal det output from the voltage detection circuit VDC. In the following description of the operation, reference is made to the flowchart of FIG. 5 in addition to FIG. 20.

If the inter-terminal voltage is equal to or higher than the operating voltage of the voltage detection circuit VDC (step ST1YES in FIG. 5), as shown in FIG. 20, the detection current I1 (current value i1) flows through the resistor R1 (resistor value r1), and the detection signal det of the magnitude r1*i1 is outputted (step ST3 in FIG. 5). Here, the first amplifier circuit AMP1 amplifies the detection signal det (step ST5 in FIG. 5), until the second amplifier circuit AMP2 starts operating (step ST4NO in FIG. 5).

Specifically, the PMOS transistor PM2 is driven by the detection signal det, and the current I2 flows through the resistor R2. As a result, the gate voltage of the NMOS transistor NM5 rises from VSS, the NMOS transistor NM5 is driven, and a current I5 flows through the resistor R 4. As a result, when the input voltage of the first output circuit OP1 rises from VSS and exceeds the threshold voltage of the first output circuit OP1, which is an inverter circuit, the drive signal dry is output from the first output circuit OP1.

In ST6 of FIG. 5, the PMOS transistor PM1 is driven by the drive signal dry outputted from the first amplifier circuit AMP1. That is, the PMOS transistor PM1 changes from the OFF state to the ON state, the discharge current IESD flows between the first terminal T1 and the second terminal T2, and the inter-terminal voltage is clamped (first clamp operation).

Next, when the second amplifier circuit AMP2 starts to operate (step ST4YES in FIG. 5), the second amplifier circuit AMP2 feedback-amplifies the detection signal det (step ST7 in FIG. 5). Since the operation of the second amplifier AMP2 is the same as that of the first embodiment described referring to FIG. 14, detailed descriptions thereof are omitted.

Next, the first amplifier circuit AMP1 amplifies the detection signal det amplified by the second amplifier circuit AMP2 (ST8 in FIG. 5). Specifically, the PMOS transistor PM2 and the NMOS transistor NM5 are driven more strongly by the amplified detection signal det, and the current I2 flowing through the resistor R2 and the current I5 flowing through the resistor R4 increase. Accordingly, the drive signal dry output from the first output circuit OP1 also increases.

As a result, the source-gate voltage of the PMOS transistor PM1, which is the discharge element DE, increases, and the PMOS transistor PM1 is driven more strongly in step ST9. That is, the PMOS transistor PM1 is turned on more strongly, the discharge current IESD increases, and the inter-terminal voltage is clamped to a voltage lower than the inter-terminal voltage of the first clamp operation.

Modified Example 1 of Second Embodiment

Figure 21:
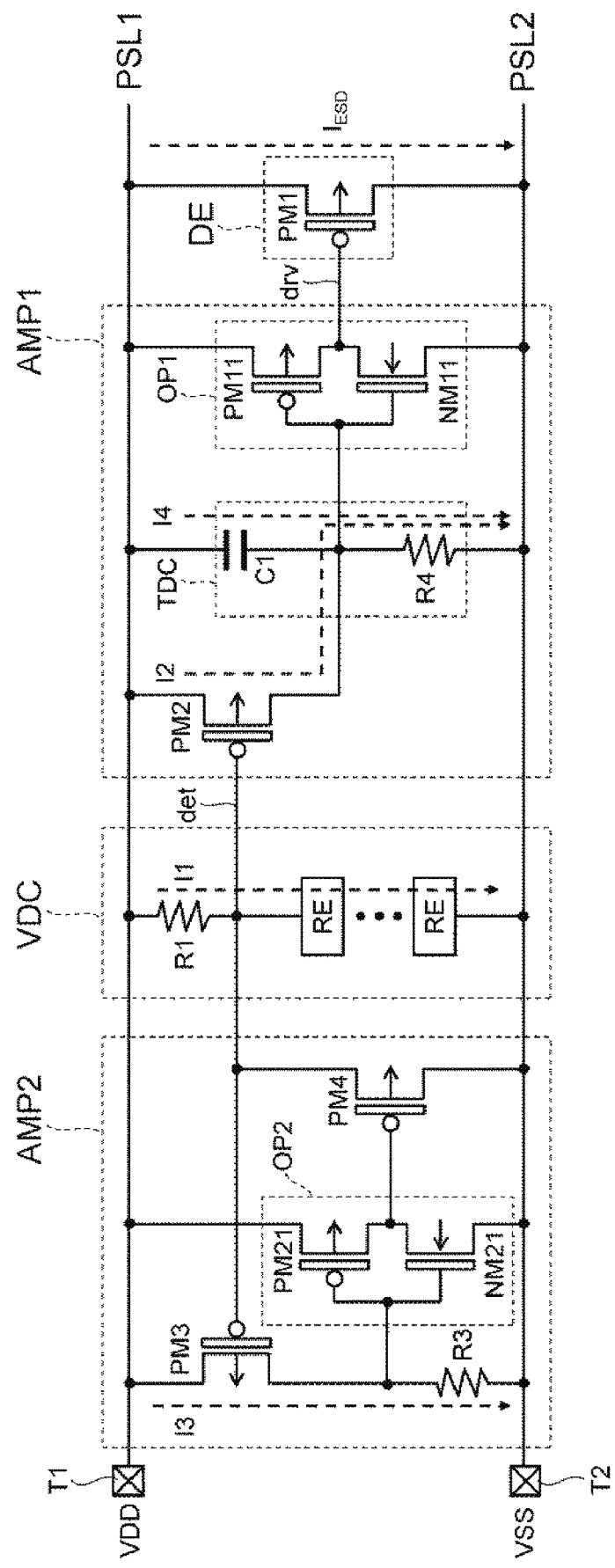
FIG. 21 is a circuit diagram illustrating a detailed configuration of a semiconductor device according to a first modified example according to a second embodiment.

Next, referring to FIG. 21, the semiconductor device according to the first modified example of the second embodiment will be described in more detail. FIG. 21 is a circuit diagram showing a detailed configuration of the semiconductor device according to the first modified example of the second embodiment.

The first amplifier circuit AMP1 of the semiconductor device shown in FIG. 21 has a simple configuration in which the resistor R2 and the NMOS transistor NM5 are removed from the first amplifier circuit AMP1 of the semiconductor device shown in FIG. 20. Accordingly, as shown in FIG. 21, the drain of the PMOS transistor PM2 is connected to the resistor R4 constituting the transient detection circuit TDC instead of the resistor R2. Other configurations are the same as those of the semiconductor device according to the second embodiment shown in FIG. 20, and therefore detailed descriptions thereof are omitted.

Operation of Modified Example 1 of Second Embodiment

Next, referring to FIG. 21, the operation of the semiconductor device according to the first modified example of the second embodiment when noises are generated will be described in more detail. In the following description of the operation, reference is made to the flowchart of FIG. 5 in addition to FIG. 21. First, when an ESD noise having a sharp rise occurs between the terminals, the semiconductor device operates in the same manner as in the semiconductor device according to the second embodiment shown in FIG. 20, and therefore detailed descriptions thereof are omitted.

On the other hand, when the noise generated between the terminals is EMS noise with a slow rise, the output signal of the transient detection circuit TDC becomes less than a predetermined threshold value (ST21NO in FIG. 18). In this instance, as shown in FIG. 18, the semiconductor device according to the first modified example of the second embodiment operates in the same manner as the semiconductor device according to the first embodiment. That is, the first amplifier circuit AMP1 amplifies not the output signal of the transient detection circuit TDC but the detection signal det output from the voltage detection circuit VDC. In the following description of the operation, reference is made to the flowchart of FIG. 5 in addition to FIG. 21.

If the inter-terminal voltage is equal to or higher than the operating voltage of the voltage detection circuit VDC (step ST1YES in FIG. 5), as shown in FIG. 21, the detection current I1 (current value i1) flows through the resistor R1 (resistance value r1), and the detection signal det of the magnitude r1*i1 is outputted (step ST3 in FIG. 5). Here, the first amplifier circuit AMP1 amplifies the detection signal det (step ST5 in FIG. 5), until the second amplifier circuit AMP2 starts operating (step ST4NO in FIG. 5).

Specifically, the PMOS transistor PM2 is driven by the detection signal det, and the current I2 flows through the resistor R4. Accordingly, when the input voltage of the first output circuit OP1 rises from VSS and exceeds the threshold voltage of the first output circuit OP1, which is an inverter circuit, the drive signal drv is output from the first output circuit OP1.

In ST6 of FIG. 5, the PMOS transistors PM1 are driven by the drive signal drvs outputted from the first amplifier circuit AMP1. That is, the PMOS transistor PM1 changes from the OFF state to the ON state, the discharge current IESD flows between the first terminal T1 and the second terminal T2, and the inter-terminal voltage is clamped (first clamp operation).

Next, when the second amplifier circuit AMP2 starts to operate (step ST4YES in FIG. 5), the second amplifier circuit AMP2 feedback-amplifies the detection signal det (step ST7 in FIG. 5). Since the operation of the second amplifier circuit AMP2 is the same as that of the first embodiment described referring to FIG. 14, detailed descriptions thereof are omitted.

Next, the first amplifier circuit AMP1 amplifies the detection signal det amplified by the second amplifier circuit AMP2 (ST8 in FIG. 5). More specifically, the PMOS transistor PM2 is driven more strongly by the amplified detection signal det, and the current I2 flowing through the resistor R4 increases. Accordingly, the drive signal dry output from the first output circuit OP1 also increases.

As a result, the source-gate voltage of the PMOS transistor PM1, which is the discharge element DE, increases, and the PMOS transistor PM1 is driven more strongly in step ST9. That is, the PMOS transistor PM1 is turned on more strongly, the discharge current IESD increases, and the inter-terminal voltage is clamped to a voltage lower than that of the first clamp operation.

Configuration of Modified Example 1 of the Second Embodiment

Figure 22:
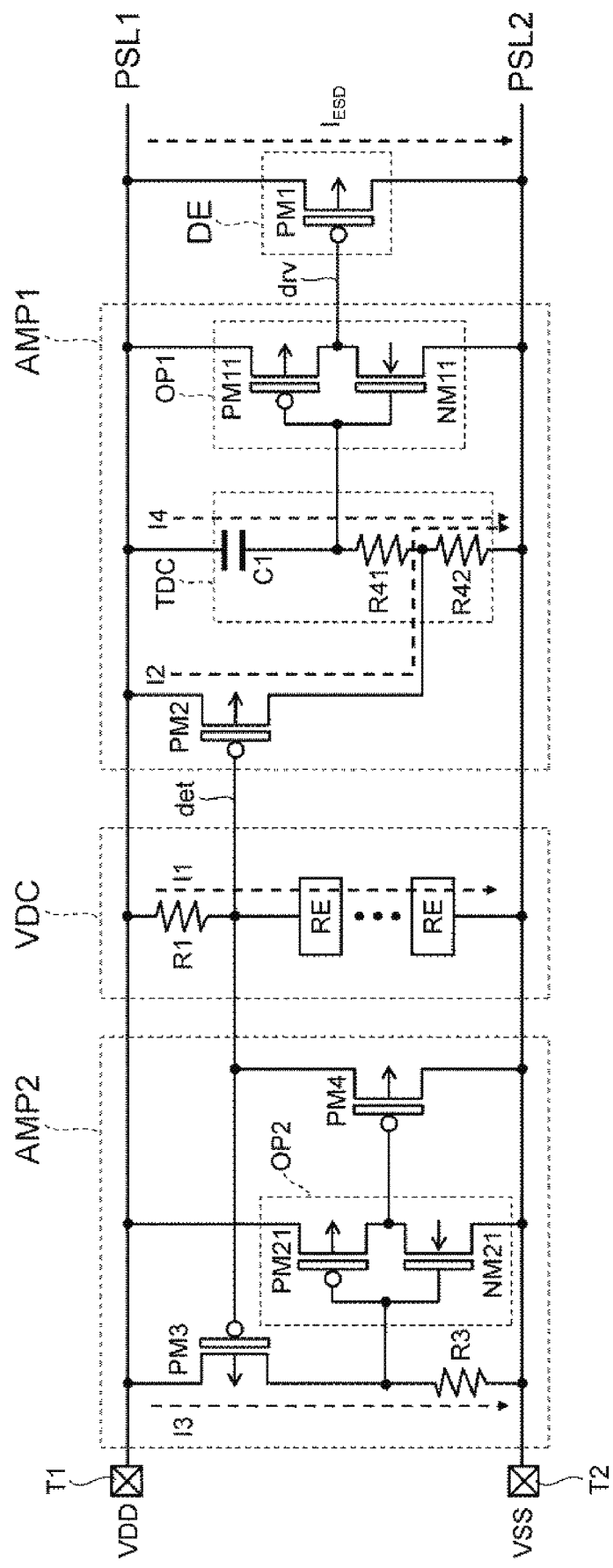
FIG. 22 is a circuit diagram illustrating a detailed configuration of a semiconductor device according to a second modified example according to a second embodiment.

Next, referring to FIG. 22, the semiconductor device according to the second modified example of the second embodiment will be described in more detail. FIG. 22 is a circuit diagram showing a detailed configuration of the semiconductor device according to the second modified example of the second embodiment.

The first amplifier circuit AMP1 of the semiconductor device shown in FIG. 22 includes resistors R41 and R42 connected in series instead of the resistor R4 in the first amplifier circuit AMP1 of the semiconductor device shown in FIG. 21. More specifically, one end of the capacitor C1 is connected to the first power supply line PSL1, and the other end of the capacitor C1 is connected to one end of the resistor R41. The other end of the resistor R41 is connected to one end of the resistor R42, and the other end of the resistor R42 is connected to the second power supply line PSL2.

The connection node between the capacitor C1 and the resistor R41 is an output node of the transient detection circuit TDC, and the connection node is connected to the input node of the first output circuit OP1. As shown in FIG. 22, the drain of the PMOS transistor PM2 is connected to the connecting node of the resistors R41 and R42. Other configurations are the same as those of the semiconductor device according to the first modified example of the second embodiment shown in FIG. 21, and therefore detailed descriptions thereof are omitted.

Operation of Modified Example 2 of Second Embodiment

Next, referring to FIG. 22, the operation of the semiconductor device according to the second modified example of the second embodiment when noises are generated will be described in more detail. In the following description of the operation, reference is made to the flowchart of FIG. 5 in addition to FIG. 22. First, when an ESD noise having a sharp rise occurs between the terminals, the semiconductor device operates in the same manner as in the semiconductor device according to the second embodiment shown in FIG. 20, and therefore detailed descriptions thereof are omitted.

On the other hand, when the noise generated between the terminals is EMS noise with a slow rise, the output signal of the transient detection circuit TDC becomes less than a predetermined threshold value (ST21NO in FIG. 18). In this instance, as shown in FIG. 18, the semiconductor device according to the second modified example of the second embodiment operates in the same manner as the semiconductor device according to the first embodiment. That is, the first amplifier circuit AMP1 amplifies not the output signal of the transient detection circuit TDC but the detection signal det output from the voltage detection circuit VDC. In the following description of the operation, reference is made to the flowchart of FIG. 5 in addition to FIG. 22.

If the inter-terminal voltage is equal to or higher than the operating voltage of the voltage detection circuit VDC (step ST1YES in FIG. 5), as shown in FIG. 21, the detection current I1 (current value i1) flows through the resistor R1 (resistance value r1), and the detection signal det of the magnitude r1*i1 is outputted (step ST3 in FIG. 5). Here, the first amplifier circuit AMP1 amplifies the detection signal det (step ST5 in FIG. 5), until the second amplifier circuit AMP2 starts operating (step ST4NO in FIG. 5).

Specifically, the PMOS transistor PM2 is driven by the detection signal det, and the current I2 flows through the resistor R42. Accordingly, when the input voltage of the first output circuit OP1 rises from VSS and exceeds the threshold voltage of the first output circuit OP1, which is an inverter circuit, the drive signal dry is output from the first output circuit OP1.

In ST6 of FIG. 5, the PMOS transistor PM1 is driven by the drive signal dry outputted from the first amplifier circuit AMP1. That is, the PMOS transistor PM1 changes from the OFF state to the ON state, the discharge current IESD flows between the first terminal T1 and the second terminal T2, and the inter-terminal voltage is clamped (first clamp operation).

Next, when the detection signal det reaches the operating voltage of the second amplifier circuit AMP2 (step ST4YES in FIG. 5), the second amplifier circuit AMP2 feedback-amplifies the detection signal det (step ST7 in FIG. 5). Since the operation of the second amplifier circuit AMP2 is the same as that of the first embodiment described referring to FIG. 14, detailed descriptions thereof are omitted.

Next, the first amplifier circuit AMP1 amplifies the detection signal det amplified by the second amplifier circuit AMP2 (ST8 in FIG. 5). More specifically, the PMOS transistor PM2 is driven more strongly by the amplified detection signal det, and the current I2 flowing through the resistor R42 increases. Accordingly, the drive signal dry output from the first output circuits OP1 also increases.

As a result, the source-gate voltage of the PMOS transistor PM1, which is the discharge element DE, increases, and the PMOS transistor PM1 is driven more strongly in step ST9. That is, the PMOS transistor PM1 is turned on more strongly, the discharge current IESD increases, and the inter-terminal voltage is clamped to a voltage lower than that of the first clamp operation.

Note that the semiconductor device shown in FIGS. 20 to 22 may have a circuit configuration in which a NMOS transistor is used as the discharge element DE instead of the PMOS transistor, similarly to the circuit configuration of the modified example of the first embodiment shown in FIGS. 15 and 16.

Although the invention made by the inventor has been specifically described based on the embodiment, the present invention is not limited to the embodiment already described, and it is needless to say that various modifications can be made without departing from the gist thereof.

For example, the semiconductor device according to the above embodiment may have a configuration in which the conductivity type (P-type or N-type) such as semiconductor substrate, a semiconducting layer, or a diffusion layer (diffusion area) is inverted. Therefore, in the case where one conductivity type of the N type and the P type is the first conductivity type and the other conductivity type is the second conductivity type, the first conductivity type may be the P type and the second conductivity type may be the N type, or on the contrary, the first conductivity type may be the N type and the second conductivity type may be the P type.

What is claimed is:

1. A semiconductor device comprising:
   a voltage detection circuit configured to output a detection signal when a voltage between a first terminal and a second terminal reaches a predetermined voltage, wherein the first terminal is a high potential side terminal, and wherein the second terminal is a low potential side terminal;
   a first amplifier circuit configured to amplify the detection signal and output a drive signal;
   a second amplifier circuit configured to feedback-amplify the detection signal; and
   a discharge element coupled between the first terminal and the second terminal and having a discharge capability depending on the drive signal,
   wherein the discharge element is a first PMOS transistor having a source coupled to the first terminal and a drain coupled to the second terminal,
   wherein the first amplifier circuit includes:
      a second PMOS transistor having a source coupled to the first terminal and a gate supplied with the detection signal;
      a first resistor having one end coupled to a drain of the second PMOS transistor and the other end coupled to the second terminal; and
      a first output circuit coupled to a connection node of the second PMOS transistor and the first resistor and configured to output the drive signal to a gate of the first PMOS transistor, and
   wherein the second amplifier circuit comprises:
      a third PMOS transistor having a source coupled to the first terminal and a gate supplied with the detection signal;
      a second resistor having one end coupled to a drain of the third PMOS transistor and the other end coupled to the second terminal;
      a second output circuit coupled to a connection node of the third PMOS transistor and the second resistor; and
      a fourth PMOS transistor having a gate supplied with an output signal of the second output circuit, a source coupled to the gate of the third PMOS transistor directly or through at least one of a plurality of rectifying elements of the voltage detection circuit, and a drain coupled to the second terminal directly or through at least one of the plurality of rectifying elements.

2. The semiconductor device according to claim 1, wherein the second amplifier circuit starts operating later than the first amplifier circuit.

3. The semiconductor device according to claim 1, wherein the first amplifier circuit includes a transient detection circuit.

4. The semiconductor device according to claim 3, wherein the transient detection circuit comprises a resistor and a capacitor coupled in series between the first terminal and the second terminal.

5. The semiconductor device according to claim 1, wherein the voltage detection circuit comprises a rectifying element string having a plurality of rectifying elements coupled in series, and a resistor coupled in series with the rectifying element string between the first terminal and the second terminal.

6. The semiconductor device according to claim 5, wherein the rectifying elements are diode elements or diode-connected MOS transistors.

7. The semiconductor device according to claim 1, wherein the predetermined voltage is higher than a power supply voltage and lower than a breakdown withstand voltage of an internal circuit.

8. A semiconductor device system comprising:
   a semiconductor device including:
      an internal circuit region in which an internal circuit including a plurality of logic circuits and a plurality of analog circuits is formed;
      a peripheral I/O region formed around the internal circuit region;
      at least one of a first power supply cell and a second power supply cell, the first power supply cell formed in the peripheral I/O region and coupled to a first terminal, and the second power supply cell formed in the peripheral I/O region and coupled to a second terminal, wherein the first terminal is a high potential side terminal, and wherein the second terminal is a low potential side terminal;
      a voltage detection circuit configured to output a detection signal when a voltage between the first terminal and the second terminal reaches a predetermined voltage;
      a first amplifier circuit configured to amplify the detection signal and output a drive signal;
      a second amplifier circuit configured to feedback-amplify the detection signal; and
      a discharge element coupled between the first terminal and the second terminal and having a discharge capability depending on the drive signal,
   wherein the discharge element is a first PMOS transistor having a source coupled to the first terminal and a drain coupled to the second terminal,
   wherein the first amplifier circuit includes:
      a second PMOS transistor having a source coupled to the first terminal and a gate supplied with the detection signal;
      a first resistor having one end coupled to a drain of the second PMOS transistor and the other end coupled to the second terminal; and
      a first output circuit coupled to a connection node of the second PMOS transistor and the first resistor and configured to output the drive signal to a gate of the first PMOS transistor, and
   wherein the second amplifier circuit comprises:
      a third PMOS transistor having a source coupled to the first terminal and a gate supplied with the detection signal;
      a second resistor having one end coupled to a drain of the third PMOS transistor and the other end coupled to the second terminal;
      a second output circuit coupled to a connection node of the third PMOS transistor and the second resistor; and
      a fourth PMOS transistor having a gate supplied with an output signal of the second output circuit, a source coupled to the gate of the third PMOS transistor directly or through at least one of a plurality of rectifying elements of the voltage detection circuit, and a drain coupled to the second terminal directly or through at least one of the plurality of the rectifying elements.

9. The semiconductor device system according to claim 8, wherein the second amplifier circuit starts operating later than the first amplifier circuit.

10. The semiconductor device system according to claim 8, wherein the first amplifier circuit includes a transient detection circuit.

11. The semiconductor device system according to claim 8, wherein the semiconductor device system is formed on one semiconductor chip.

12. The semiconductor device system according to claim 8, wherein he predetermined voltage is higher than a power supply voltage and lower than a breakdown withstand voltage of the internal circuit.

13. A semiconductor device comprising:
   a voltage detection circuit configured to output a detection signal when a voltage between a first terminal and a second terminal reaches a predetermined voltage, wherein the first terminal is a high potential side terminal, and wherein the second terminal is a low potential side terminal;
   a first amplifier circuit having a first input node and a first output node, the first input node coupled to the voltage detection circuit and supplied with the detection signal, the first amplifier circuit amplifying a signal supplied to the first input node and output a drive signal from the first output node;
   a second amplifier circuit supplied with the detection signal, amplifying the detection signal, and outputting an amplified signal to the first input node; and
   a discharge element coupled between the first terminal and the second terminal and controlling a discharge current flowing between the first terminal and the second terminal based on the drive signal,
   wherein the discharge element comprises a first NMOS transistor having a source coupled to the second terminal and a drain coupled to the first terminal,
   wherein the first amplifier circuit comprises:
      a second NMOS transistor having a source coupled to the second terminal and a gate supplied with the detection signal;
      a first resistor having one end coupled to a drain of the second NMOS transistor and the other end coupled to the first terminal; and
      a first output circuit coupled to a connection node of the second NMOS transistor and the first resistor and configured to output the drive signal to a gate of the first NMOS transistor,
   wherein the second amplifier circuit comprises:
      a third NMOS transistor having a source coupled to the second terminal and a gate supplied with the detection signal;
      a second resistor having one end coupled to a drain of the third NMOS transistor and the other end coupled to the first terminal;
      a second output circuit coupled to a connection of the third NMOS transistor and the second resistor; and
      a fourth NMOS transistor having a gate supplied with an output signal of the second output circuit, a source coupled to the gate of the third NMOS transistor directly or through at least one of a plurality of rectifying elements of the voltage detection circuit, and a drain coupled to the first terminal directly or through at least one of the plurality of the rectifying elements, wherein the first amplifier circuit configured to output a first drive signal when the first input node is supplied with the detection signal, and to output a second drive signal when the first input node is supplied with the amplified signal of the second amplifier circuit, and wherein the discharge current based on the second drive signal is larger than the discharge current based on the first drive signal.

14. The semiconductor device according to claim 13, wherein the first amplifier circuit and the second amplifier circuit are coupled between the first terminal and the second terminal, respectively, wherein the first amplifier circuit outputs the first drive signal when a voltage between the first terminal and the second terminal reaches the predetermined voltage, and wherein the second amplifier circuit outputs the amplified signal when the voltage between the first terminal and the second terminal reaches a voltage different from the predetermined voltage.

* * * * *